(12) United States Patent  (10) Patent No.: US 7,396,475 B2
Sreenivasan  (45) Date of Patent: *Jul. 8, 2008

(54) METHOD OF FORMING STEPPED STRUCTURES EMPLOYING IMPRINT LITHOGRAPHY

(75) Inventor: Sidlgata V. Sreenivasan, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 86 days.

This patent is subject to a terminal disclaimer.

(21) Appl. No.: 10/423,642

(22) Filed: Apr. 25, 2003

(65) Prior Publication Data

US 2004/0211754 A1  Oct. 28, 2004

(51) Int. Cl.
  *H01L 21/302* (2006.01)
(52) U.S. Cl. .................... 216/2; 216/11; 216/13; 216/17; 216/19; 216/39; 216/41; 216/44; 216/47; 216/49; 216/52; 438/700; 438/703; 430/311; 430/316; 430/317
(58) Field of Classification Search ............ 216/2, 216/11, 13, 17, 18, 38, 39, 41, 44, 47, 49, 216/52; 438/700, 703; 264/320; 430/311–313, 430/316–317
See application file for complete search history.

(56) References Cited

U.S. PATENT DOCUMENTS

| | | |
|---|---|---|
| 3,783,520 A | 1/1974 | King |
| 3,810,874 A | 5/1974 | Mitsch et al. |
| 4,070,116 A | 1/1978 | Frosch et al. |
| 4,119,688 A | 10/1978 | Hiraoka |
| 4,201,800 A | 5/1980 | Alcorn et al. |
| 4,267,212 A | 5/1981 | Sakawaki |
| 4,426,247 A | 1/1984 | Tamamura et al. |
| 4,507,331 A | 3/1985 | Hiraoka |
| 4,512,848 A | 4/1985 | Deckman et al. |
| 4,552,833 A | 11/1985 | Ito et al. |
| 4,600,309 A | 7/1986 | Fay |
| 4,614,667 A | 9/1986 | Larson et al. |
| 4,657,845 A | 4/1987 | Frechet et al. |
| 4,692,205 A | 9/1987 | Sachdev et al. |
| 4,707,218 A | 11/1987 | Giammarco et al. |
| 4,731,155 A | 3/1988 | Napoli et al. |
| 4,737,425 A | 4/1988 | Lin et al. |
| 4,808,511 A | 2/1989 | Holmes |
| 4,826,943 A | 5/1989 | Ito et al. |

(Continued)

FOREIGN PATENT DOCUMENTS

DE  2800476  7/1978

(Continued)

OTHER PUBLICATIONS

Webster's II New Riverside Univ. Dictionary, 1994, p. 641.*

(Continued)

*Primary Examiner*—Anita K Alanko
(74) *Attorney, Agent, or Firm*—Michael D. Carter; Fish & Richardson P.C.

(57) ABSTRACT

The present invention provides a method for forming a stepped structure on a substrate that features transferring, into the substrate, an inverse shape of the stepped structure disposed on the substrate.

25 Claims, 15 Drawing Sheets

U.S. PATENT DOCUMENTS

| | | | |
|---|---|---|---|
| 4,848,911 A | 7/1989 | Uchida et al. | |
| 4,857,477 A | 8/1989 | Kanamori | |
| 4,891,303 A | 1/1990 | Garza et al. | |
| 4,908,298 A | 3/1990 | Hefferon et al. | |
| 4,919,748 A | 4/1990 | Bredbenner et al. | |
| 4,921,778 A | 5/1990 | Thackeray et al. | |
| 4,931,351 A | 6/1990 | McColgin et al. | |
| 4,959,252 A | 9/1990 | Bonnebat et al. | |
| 4,964,945 A | 10/1990 | Calhoun | |
| 4,976,818 A | 12/1990 | Hashimoto et al. | |
| 4,980,316 A | 12/1990 | Huebner | |
| 4,999,280 A | 3/1991 | Hiraoka | |
| 5,028,366 A | 7/1991 | Harakal et al. | |
| 5,053,318 A | 10/1991 | Gulla et al. | |
| 5,071,694 A | 12/1991 | Uekita et al. | |
| 5,074,667 A | 12/1991 | Miyatake | |
| 5,108,875 A | 4/1992 | Thackeray et al. | |
| 5,110,514 A | 5/1992 | Soane | |
| 5,148,036 A | 9/1992 | Matsugu et al. | |
| 5,148,037 A | 9/1992 | Suda et al. | |
| 5,151,754 A | 9/1992 | Ishibashi et al. | |
| 5,169,494 A | 12/1992 | Hashimoto et al. | |
| 5,173,393 A | 12/1992 | Sezi et al. | |
| 5,179,863 A | 1/1993 | Uchida et al. | |
| 5,198,326 A | 3/1993 | Hashimoto et al. | |
| 5,206,983 A | 5/1993 | Guckel et al. | |
| 5,212,147 A | 5/1993 | Sheats | |
| 5,234,793 A | 8/1993 | Sebald et al. | |
| 5,240,550 A | 8/1993 | Boehnke et al. | |
| 5,240,878 A | 8/1993 | Fitzsimmons et al. | |
| 5,242,711 A | 9/1993 | DeNatale et al. | |
| 5,244,818 A | 9/1993 | Jokerst et al. | |
| 5,259,926 A * | 11/1993 | Kuwabara et al. | 216/54 |
| 5,314,772 A | 5/1994 | Kozicki et al. | |
| 5,318,870 A | 6/1994 | Hartney | |
| 5,324,683 A | 6/1994 | Fitch et al. | |
| 5,328,810 A | 7/1994 | Lowrey et al. | |
| 5,330,881 A | 7/1994 | Sidman et al. | |
| 5,362,606 A | 11/1994 | Hartney et al. | |
| 5,366,851 A | 11/1994 | Novembre | |
| 5,374,454 A | 12/1994 | Bickford et al. | |
| 5,376,810 A | 12/1994 | Hoenk et al. | |
| 5,380,474 A | 1/1995 | Rye et al. | |
| 5,389,696 A | 2/1995 | Dempsey et al. | |
| 5,417,802 A | 5/1995 | Obeng | |
| 5,421,981 A | 6/1995 | Leader et al. | |
| 5,422,295 A | 6/1995 | Choi et al. | |
| 5,424,549 A | 6/1995 | Feldman | |
| 5,425,848 A | 6/1995 | Haisma et al. | |
| 5,431,777 A | 7/1995 | Austin et al. | |
| 5,434,107 A | 7/1995 | Paranjpe | |
| 5,439,766 A | 8/1995 | Day et al. | |
| 5,453,157 A | 9/1995 | Jeng | |
| 5,458,520 A | 10/1995 | DeMercurio et al. | |
| 5,468,542 A | 11/1995 | Crouch | |
| 5,480,047 A | 1/1996 | Tanigawa et al. | |
| 5,512,131 A | 4/1996 | Kumar et al. | |
| 5,527,662 A | 6/1996 | Hashimoto et al. | |
| 5,542,978 A | 8/1996 | Kindt-Larsen et al. | |
| 5,545,367 A | 8/1996 | Bae et al. | |
| 5,597,438 A | 1/1997 | Grewel et al. | |
| 5,601,641 A | 2/1997 | Stephens | |
| 5,654,238 A | 8/1997 | Cronin et al. | |
| 5,669,303 A | 9/1997 | Maracas et al. | |
| 5,670,415 A | 9/1997 | Rust | |
| 5,700,626 A | 12/1997 | Lee et al. | |
| 5,725,788 A | 3/1998 | Maracas et al. | |
| 5,736,424 A | 4/1998 | Prybyla et al. | |
| 5,743,998 A | 4/1998 | Park | |
| 5,753,014 A | 5/1998 | Van Rijn | |
| 5,772,905 A | 6/1998 | Chou | |
| 5,776,748 A | 7/1998 | Singhvi et al. | |
| 5,820,769 A | 10/1998 | Chou | |
| 5,837,314 A | 11/1998 | Beaton et al. | |
| 5,849,209 A | 12/1998 | Kindt-Larsen et al. | |
| 5,849,222 A | 12/1998 | Jen et al. | |
| 5,855,686 A | 1/1999 | Rust | |
| 5,888,650 A | 3/1999 | Calhoun et al. | |
| 5,895,263 A | 4/1999 | Carter et al. | |
| 5,900,160 A | 5/1999 | Whitesides et al. | |
| 5,902,491 A * | 5/1999 | Carpenter et al. | 216/2 |
| 5,905,104 A | 5/1999 | Eklund et al. | |
| 5,907,782 A | 5/1999 | Wu | |
| 5,926,690 A | 7/1999 | Toprac et al. | |
| 5,948,219 A | 9/1999 | Rohner | |
| 5,948,470 A | 9/1999 | Harrison et al. | |
| 5,948,570 A | 9/1999 | Kornblit et al. | |
| 5,956,216 A | 9/1999 | Chou | |
| 5,962,191 A | 10/1999 | Nozaki et al. | |
| 6,033,977 A | 3/2000 | Gutsche et al. | |
| 6,035,805 A | 3/2000 | Rust | |
| 6,039,897 A | 3/2000 | Lochhead et al. | |
| 6,046,056 A | 4/2000 | Parce et al. | |
| 6,071,372 A | 6/2000 | Ye et al. | |
| 6,074,827 A | 6/2000 | Nelson et al. | |
| 6,096,655 A | 8/2000 | Lee et al. | |
| 6,143,412 A | 11/2000 | Schueller et al. | |
| 6,150,190 A | 11/2000 | Stankus et al. | |
| 6,150,231 A | 11/2000 | Muller et al. | |
| 6,150,680 A | 11/2000 | Eastman et al. | |
| 6,168,845 B1 | 1/2001 | Fontana, Jr. et al. | |
| 6,204,343 B1 | 3/2001 | Barucha et al. | |
| 6,218,316 B1 | 4/2001 | Marsh | |
| 6,232,175 B1 * | 5/2001 | Liu et al. | 438/253 |
| 6,245,581 B1 | 6/2001 | Bonser et al. | |
| 6,274,294 B1 | 8/2001 | Hines | |
| 6,309,580 B1 | 10/2001 | Chou | |
| 6,326,627 B1 | 12/2001 | Putvinski et al. | |
| 6,329,256 B1 | 12/2001 | Ibok | |
| 6,334,960 B1 | 1/2002 | Willson et al. | |
| 6,342,097 B1 | 1/2002 | Terry et al. | |
| 6,355,198 B1 | 3/2002 | Kim et al. | |
| 6,383,928 B1 | 5/2002 | Eissa | |
| 6,387,783 B1 | 5/2002 | Furukawa et al. | |
| 6,387,787 B1 * | 5/2002 | Mancini et al. | 438/586 |
| 6,388,253 B1 | 5/2002 | Su | |
| 6,391,217 B2 | 5/2002 | Schaffer et al. | |
| 6,391,798 B1 | 5/2002 | DeFelice et al. | |
| 6,426,288 B1 | 7/2002 | Meikle | |
| 6,455,411 B1 | 9/2002 | Jiang et al. | |
| 6,468,642 B1 | 10/2002 | Bray et al. | |
| 6,468,853 B1 | 10/2002 | Balasubramanian et al. | |
| 6,468,896 B2 | 10/2002 | Rohr et al. | |
| 6,482,742 B1 | 11/2002 | Chou | |
| 6,489,068 B1 | 12/2002 | Kye | |
| 6,495,430 B1 | 12/2002 | Tsai et al. | |
| 6,503,914 B1 | 1/2003 | Benish et al. | |
| 6,514,672 B2 | 2/2003 | Young et al. | |
| 6,517,977 B2 * | 2/2003 | Resnick et al. | 430/5 |
| 6,517,995 B1 | 2/2003 | Jacobenson et al. | |
| 6,518,168 B1 | 2/2003 | Clem et al. | |
| 6,518,189 B1 | 2/2003 | Chou | |
| 6,534,418 B1 | 3/2003 | Plat et al. | |
| 6,541,360 B1 | 4/2003 | Plat et al. | |
| 6,544,594 B2 | 4/2003 | Linford et al. | |
| 6,561,706 B2 | 5/2003 | Singh et al. | |
| 6,565,776 B1 | 5/2003 | Li et al. | |
| 6,565,928 B2 | 5/2003 | Sakamoto et al. | |
| 6,566,258 B1 | 5/2003 | Dixit et al. | |
| 6,580,172 B2 | 6/2003 | Mancini et al. | |
| 6,632,742 B2 | 10/2003 | Yang et al. | |
| 6,635,581 B2 | 10/2003 | Wong | |
| 6,646,662 B1 | 11/2003 | Nebashi et al. | |
| 6,649,272 B2 | 11/2003 | Moore et al. | |

| | | |
|---|---|---|
| 6,664,306 B2 | 12/2003 | Gaddam et al. |
| 6,677,252 B2 | 1/2004 | Marsh |
| 6,686,271 B2 | 2/2004 | Raaijmakers et al. |
| 6,696,220 B2 | 2/2004 | Bailey et al. |
| 6,703,190 B2 | 3/2004 | Elian et al. |
| 6,713,238 B1 | 3/2004 | Chou et al. |
| 6,716,767 B2 | 4/2004 | Shih et al. |
| 6,719,915 B2 | 4/2004 | Willson et al. |
| 6,721,529 B2 | 4/2004 | Chen et al. |
| 6,730,256 B1 | 5/2004 | Bloomstein et al. |
| 6,737,202 B2 | 5/2004 | Gehoski et al. |
| 6,737,489 B2 | 5/2004 | Linert et al. |
| 6,743,713 B2 | 6/2004 | Mukherjee-Roy et al. |
| 6,759,325 B2 | 7/2004 | Raaijmakers et al. |
| 6,767,983 B1 | 7/2004 | Fujiyama et al. |
| 6,770,852 B1 | 8/2004 | Steger |
| 6,774,183 B1 | 8/2004 | Palumbo et al. |
| 6,776,094 B1 | 8/2004 | Whitesides et al. |
| 6,777,170 B1 | 8/2004 | Bloomstein et al. |
| 6,790,905 B2 | 9/2004 | Fitzgerald et al. |
| 6,802,870 B2 | 10/2004 | Chang et al. |
| 6,809,356 B2 | 10/2004 | Chou |
| 6,814,879 B2 | 11/2004 | Shibata |
| 6,820,677 B2 * | 11/2004 | Grinberg et al. ............... 164/46 |
| 6,828,244 B2 | 12/2004 | Chou |
| 6,830,819 B2 | 12/2004 | Kaplan et al. |
| 6,849,558 B2 | 2/2005 | Schaper |
| 6,900,881 B2 | 5/2005 | Sreenivasan et al. |
| 6,908,861 B2 | 6/2005 | Sreenivasan et al. |
| 6,916,584 B2 | 7/2005 | Sreenivasan et al. |
| 6,932,934 B2 | 8/2005 | Choi et al. |
| 7,179,396 B2 * | 2/2007 | Sreenivasan ................ 216/44 |
| 7,186,656 B2 * | 3/2007 | Sreenivasan ................ 438/700 |
| 7,205,244 B2 * | 4/2007 | Stacey ........................ 438/735 |
| 7,261,831 B2 * | 8/2007 | Sreenivasan ................ 216/44 |
| 2002/0042027 A1 | 4/2002 | Chou et al. |
| 2002/0132482 A1 | 9/2002 | Chou |
| 2002/0167117 A1 | 11/2002 | Chou |
| 2002/0177319 A1 | 11/2002 | Chou |
| 2003/0034329 A1 | 2/2003 | Chou |
| 2003/0062334 A1 | 4/2003 | Lee et al. |
| 2003/0080471 A1 | 5/2003 | Chou |
| 2003/0080472 A1 | 5/2003 | Chou |
| 2003/0081193 A1 | 5/2003 | White et al. |
| 2003/0113638 A1 | 6/2003 | Mancini et al. |
| 2003/0129542 A1 | 7/2003 | Shih et al. |
| 2004/0007799 A1 | 1/2004 | Choi et al. |
| 2004/0008334 A1 | 1/2004 | Sreenivasan et al. |
| 2004/0009673 A1 | 1/2004 | Sreenivasan et al. |
| 2004/0021254 A1 | 2/2004 | Sreenivasan et al. |
| 2004/0021866 A1 | 2/2004 | Watts et al. |
| 2004/0022888 A1 | 2/2004 | Sreenivasan et al. |
| 2004/0029041 A1 | 2/2004 | Shih et al. |
| 2004/0036201 A1 | 2/2004 | Chou et al. |
| 2004/0046288 A1 | 3/2004 | Chou |
| 2004/0110856 A1 | 6/2004 | Young et al. |
| 2004/0118809 A1 | 6/2004 | Chou et al. |
| 2004/0124566 A1 | 7/2004 | Sreenivasan et al. |
| 2004/0131718 A1 | 7/2004 | Chou et al. |
| 2004/0137734 A1 | 7/2004 | Chou et al. |
| 2004/0156108 A1 | 8/2004 | Chou et al. |
| 2004/0188381 A1 * | 9/2004 | Sreenivasan ................ 216/40 |
| 2004/0192041 A1 | 9/2004 | Jeong et al. |
| 2004/0197843 A1 | 10/2004 | Chou et al. |
| 2004/0224261 A1 | 11/2004 | Resnick et al. |
| 2004/0250945 A1 * | 12/2004 | Zheng et al. ................ 156/230 |
| 2005/0037143 A1 | 2/2005 | Chou et al. |
| 2005/0253307 A1 | 11/2005 | Sreenivasan et al. |
| 2006/0060557 A1 * | 3/2006 | Sreenivasan et al. .......... 216/11 |
| 2006/0063112 A1 | 3/2006 | Sreenivasan et al. |
| 2006/0063277 A1 | 3/2006 | Vidusek et al. |
| 2006/0063387 A1 | 3/2006 | Miller et al. |
| 2006/0076717 A1 | 4/2006 | Sreenivasan et al. |
| 2006/0077374 A1 | 4/2006 | Sreenivasan et al. |
| 2006/0138080 A1 * | 6/2006 | Hasegawa et al. ............. 216/44 |
| 2007/0052461 A1 | 3/2007 | Sreenivasan |
| 2007/0243279 A1 | 10/2007 | McMackin et al. |

FOREIGN PATENT DOCUMENTS

| | | |
|---|---|---|
| JP | 55-88332 | 12/1978 |
| JP | 57-7931 | 1/1982 |
| JP | 63-138730 | 12/1986 |
| JP | 1-196749 | 8/1989 |
| JP | 02-24848 | 1/1990 |
| JP | 02-92603 | 4/1990 |
| JP | 02192045 | 7/1990 |
| JP | 09311460 A * | 12/1997 |
| WO | WO 87/02935 | 5/1987 |
| WO | WO 99/05724 | 2/1999 |
| WO | WO 00/21689 | 4/2000 |
| WO | WO 01/47003 A2 | 12/2000 |
| WO | WO 01/53889 | 7/2001 |
| WO | WO 01/69317 | 9/2001 |
| WO | WO 01/90816 | 11/2001 |
| WO | WO 02/07199 | 1/2002 |
| WO | WO 03/010289 | 2/2003 |
| WO | WO 03/079416 | 9/2003 |
| WO | WO 03/099536 | 12/2003 |
| WO | WO 2004/114016 | 12/2004 |
| WO | WO 2005/031299 A2 | 4/2005 |
| WO | WO 2005/031855 A1 | 4/2005 |

OTHER PUBLICATIONS

Heidari et al., "Nanoimprint Lithography at the 6 in. Wafer Scale," Journal of Vacuum Science Technology, Nov./Dec. 2000, pp. 3557-3560, vol. B, No. 18(6).
Abstract of Japanese Patent 63-138730.
Abstract of Japanese Patent 55-88332.
Abstract of Japanese Patent 57-7931.
Abstract of Japanese Patent 02-24848.
Translation of Japanese Patent 02-24848.
Abstract of Japanese Patent 02-92603.
Translation of Japanese Patent 02-92603.
Feynman, Richard P., "There's Plenty of Room at the Bottom—An Invitation to Enter a New Field of Physics," 12 pp [online[ Retrieved Sep. 23, 2004 from URL: http://www.zyvex.com/nanotech/feynman.html.
Hu, Shengkui et al., "Fluorescence Probe Techniques (FPT) for Measuring the Relative Efficiencies of Free-Radical Photoinitiators," S0024-9297(97)01390-9; "Macromolecules" 1998, vol. 31, pp. 4017-4113, 1998 American Chemical Society. Published on Web May 29, 1998.
Feynman, Richard P., "There's Plenty of Room at the Bottom—An Invitation to Enter a New Field of Physics," 12 pp. [online] Retrieved from URL: http://www.zyvex.com/nanotech/feynman.html, transcript of talk given Dec. 29, 1959.
Krug et al., "Fine Patterning of Thin Sol-Gel Films," Journal of Non-Crystalline Solids, 1992, pp. 447-450, vol. 147 & 148.
Kotachi et al., "Si-Containing Positive Resist for ArF Laser Lithography," J. PhotopolymerSci. Tevhnol. 8(4) 615-622, 1995.
Krauss et al., "Fabrication of Nanodevices Using Sub-25nm Imprint Lithography," Appl. Phys. Lett 67(21), 3114-3116, 1995.
Chou et al., "Imprint of Sub-25 nm Vias and Trenches in Polymers," Applied Physics Letters, Nov. 20, 1995, pp. 3114-3116, vol. 67(21).
Chou et al., "Imprint Lithography with 25-Nanometer Resolution," Science, Apr. 5, 1996, pp. 85-87, vol. 272.
Haisma et al., "Mold-Assisted Nanolithography: A Process for Reliable Pattern Replication," Journal of Vacuum Science and Technology, Nov./Dec. 1996, pp. 4124-4128, vol. B 14(6).
Chou et al., "Imprint Lithography with Sub-10nm Feature Size and High Throughput," Microelectronic Engineering, 1997, pp. 237-240, vol. 35.
Scheer et al., "Problems of the Nanoimprinting Technique for Nanometer Scale Pattern Definition," Journal of Vacuum Science and Technology, Nov./Dec. 1998, pp. 3917-3921, vol. B 16(6).

Xia et al., "Soft Lithography," Annu. Rev. Mater. Sci., 1998, pp. 153-184, vol. 28.

Xia et al., "Soft Lithography," Agnew. Chem. Int. Ed., 1998, pp. 550-575, vol. 37.

Wu et al., "Large Area High Density Quantized Magnetic Disks Fabricated Using Nanoimprint Lithography," Journal of Vacuum Science and Technology, Nov./Dec. 1998, pp. 3825-3829, vol. B 16(6).

Colburn. et al., "Step and Flash Imprint Lithography: A New Approach to High-Resolution Patterning", Proc. of SPIE, 1999, pp. 379-389, vol. 3676.

Chou et al., "Lithographically-Induced Self Assembly of Periodic Polymer Micropillar Arrays," Journal of Vacuum Science and Technology, Nov./Dec. 1999, pp. 3197-3202, vol. B 17(6).

Ruchhoeft et al., "Patterning Curved Surfaces: Template Generation by Ion Beam Proximity Lithography and Relief Transfer by Step and Flash Imprint Lithography," Journal of Vacuum Science and Technology, 1999, pp. 2965-2982, vol. 17.

Choi et al., "Design of Orientation Stages for Step and Flash Imprint Lithography," Precision Engineering, Journal of the International Societies for Precision Engineering and Nanotechnology, 2001, pp. 192-199, vol. 25.

Chou, "Nanoimprint Lithography and Lithographically Induced Self-Assembly," MRS Bulletin, Jul. 2001, pp. 512-517.

Mirkin et al., "Emerging Methods for Micro-and Nanofabrication," MRS Bulletin, Jul. 2001, pp. 506-509.

Choi et al., "High Precision Orientation Alignment and Gap Control Stages for Imprint Lithography Processes," U.S. Appl. No. 09/698,317, filed Oct. 27, 2000.

Bender M. et al., "Fabrication of Nanostructures using a UV-based Imprint Technique," Microelectronic Engineering, pp. 223-236, 2000.

Sreenivasan et al., "High-Resolution Overlay Alignment Methods and Systems for Imprint Lithography," U.S. Appl. No. 09/907,512, filed Jul. 16, 2001.

Choi et al., "Method and System of Automatic Fluid Dispensing for Imprint Lithography Processes," U.S. Appl. No. 09/908,455, filed July 17, 2001.

Choi et al., "Methods for High-Precision Gap and Orientation Sensing Between a Transparent Template and Substrate for Imprint Lithography," U.S. Appl. No. 09/920,341, filed Aug. 1, 2001.

Nguyen, A. Q., "Asymmetric Fluid-Structure Dynamics in Nanoscale Imprint Lithography," University of Texas at Austin, Aug. 2001.

Otto M. et al, "Characterization and Application of a UV-based Imprint Technique," Microelectronic Engineering, pp. 361-366, 2001.

Choi et al., "Flexture Based Macro Motion Translation Stage," U.S. Appl. No. 09/934,248, filed Aug. 21, 2001.

Bailey et al., "Template for Room Temperature Low Pressure Micro- and Nano-Imprint Lithography," U.S. Appl. No. 09/976,681, filed Oct. 12, 2001.

Voisin, "Methods of Manufacturing a Lithography Template," U.S. Appl. No. 10/136,188, filed May 1, 2002.

Willson et al., "Method and System for Fabricating Nanoscale Patterns in Light Curable Compositions Using an Electric Field," U.S. Appl. No. 09/905,718, filed May 16, 2002.

Sreenivasan et al., "Step and Repeat Imprint Lithography Systems," U.S. Appl. No. 10/194,414, filed Jul. 11, 2002.

Sreenivasan et al., "Step and Repeat Imprint Lithography Processes," U.S. Appl. 10/194,991, filed Jul. 11, 2002.

Otto et al., "Step and Repeat UV-Nanoimprint Lithography: Material Issues," Nanoimprint and Nanoprint Technology Conference, San Francisco, Dec. 11-13, 2002.

Johnson et al., "Advances in Step and Flash Imprint Lithography," SPIE Microlithography Conference, Feb. 23-28, 2003.

Sreenivasan, "Positive Tone Bi-Layer Imprint Lithography Method," U.S. Appl. 10/396,615, filed Mar. 25, 2003.

Lin, Multi-Layer Resist Systems, Introduction to Microlithography, pp. 287-349 Feb. 14, 1983.

Luurtsema, Spin Coating for Rectangular Substrates, Retrieved May 23, 2002 from URL: http://buffy.eecs.berkelye.edu/IRO/Summary/97abstracts/gluurts.2.html May 23, 2002.

Photoresist Coating Methods, e-mail from Susan Bagen(BAGEN@aol.com) to Dhaval Shah Sep. 18, 1997.

Nakamatsu et al., Bilayer Resist Method for Room-Temperature Nanoimprint Lithography, Japanese Journal of Applied Physics, vol. 43, No. 6B, pp. 4050-4053 Jun. 29, 2004.

U.S. Appl. No. 10/946,574, naming inventors Stacey et al., entitled Patterning Substrates Employing Multi-Film Layers Defining Etch-Differential Interfaces, filed Sep. 21, 2004.

U.S. Appl. No. 11/126,946, naming inventors Choi et al., entitled Formation of Discontinuous Films During an Imprint Lithography Process, filed May 11, 2005.

Klaus et al., SiO2 Chemical Vapor Deposition at Room Temperature Using SiCl4 and H2O with and NH3 Catalyst, J. Electrochem. Soc. 147, 2658-2664 Jan. 1, 2000.

Li et al., Exploring Low Temperature High Density Inductive Coupled Plasma Chemical Vapor Deposition (HDICPCVD) Dielectric Films for MMICs, Project Report 1002-03 for MICRO Project 02-041, no date.

Plasma Enhanced Chemical Vapor Deposition (PECVD), http://yuekuo.tamu.edu/pecvd.thm, no date.

Sahu et al., Influence of Hydrogen on Losses in Silicon Oxynitride Planar Optical Waveguides, Semicond. Sci. Technol. 15,pp. L11-L14 Mar. 1, 2000.

Amato-Wierda et al., Abstract of Low Temperature Chemical Vapor Deposition of Titanium Nitride Them Films with Hydrazine and Tetrakis(dimethylamido)titanium, Electrochemical and Solid-State Ltters, vol. 2, Issue 12, pp. 613-615. Dec. 1, 1999.

Gruska et al., ICPECVD Low Temperature (less than or equal to 130 C) Deposiion of SiOx, SiOxNy and SiNx Films, 6th Israeli Conference on Plasma Science and Applications, no date.

U.S. Appl. No. 11/184, 664, naming inventors LaBrake, entitled Method of controlling the critical dimension of structures formed on a substrate, filed Jul. 19, 2005.

Miller et al., Fabrication of Nanometer Sized Features on Non-Flat Substrates Using a Nano-Imprint Lithography Process, SPIE Microlithography Conference Feb. 1, 2005.

Nordquist et al., Image Placement Issues for ITO-based Step and Flash Imprint Lithography Templates, J. Vac. Sci. Technol. B, pp. 695-701 Mar. 1, 2004.

Stewart et al., Direct Imprinting of Dielectric Materials for Dual Damascene Processing, SPIE Microlithography Conference Feb. 1, 2003.

Smith et al., Employing Step and Flash Imprint Lithography for Gate Level Patterning of a MOSFET Device, SPIE Microlithography Conference Feb. 1, 2003.

Data Sheet for gamma-Glycidoxypropyltrimethoxysilane, www.powerchemical.net/3100.htm, Dec. 5, 2003.

Silicon or Silica, www.mii.org/Minerals/photosil, Mar. 31, 2005.

Electronic Devices and Circuits, people.deas.harvard.edu/~jones/es154/lectures/lecture_2/materials/materials.html, Mar. 31, 2005.

Data Sheet for Cymel 303ULF, www.cytec.com, no date available.

Data Sheet for Cycat 4040, www.cytec.com, no date available.

International Chemical Safety Card for p-Toluenseulfonic Acid, www.itcilo.it/english/actrav/telearn/osh/ic/104154.htm, Dec. 5, 2003.

Data Sheet for p-Toluenesulfonic Acid, NIOSH Manual of Analytical Methods (NMAM), Fourth Edition, Jan. 15, 1998.

Data Sheet for Dow Corning Z-6018, 2001, no month or day available.

Data Sheet for Methyl Amyl Ketone, www.arb.ca.gov/db/solvents/solvent_pages/Ketones-HTML/methyl_amyl.htm, Mar. 31, 2005.

Colburn et al., Step and Flash Imprint Lithography for sub-100 nm Patterning, Proceedings of SPIE vol. 3997, pp. 453-457, Jan. 1, 2000.

Chou et al., Ultrafast and Direct Imprint of Nanostructures in Silicon, Nature, col. 417, (Jun. 2002), pp. 835-837, Jun. 1, 2002.

Chou et al., Nanoimprint Lithography, Journal of Vacuum Science Technology B 14(16), pp. 4129-4133, Nov. 1, 1996.

Colburn et al., Development and Advantages of Step-and-Flash Lithography, Solid State Technology, Jul. 1, 2001.

Colburn et al., Characterization and Modeling of Volumetric and Mechanical Properties for Step and Flash Imprint Lithography Photopolymers, Journal of Vacuum Science Technology. vol. b. 19(6), Nov. 1, 2001.

Bailey et al., Step and Flash Imprint Lithography: Defect Analysis, Journal of Vacuum Science, B 19(6), pp. 2806-2810, Nov. 1, 2001.

Bailey et al., Step and Flash Imprint Lithography: Template Surface Treatment and Defect Analysis, Journal of Vacuum Science, B 18(6), 3572-3577, Nov. 1, 2000.

Schneider et al., Stripes of Partially Fluorinated Alkyl Chains: Dipolar Langmuir Monolayers, no date available.

Data Sheet for MAK (Methyl n-Amyl Ketone), www.sp-chem.com/fine_e, Jan. 1, 2003, no date available.

* cited by examiner

METHOD OF FORMING STEPPED STRUCTURES EMPLOYING IMPRINT LITHOGRAPHY

BACKGROUND OF THE INVENTION

The field of invention relates generally to micro-fabrication of structures. More particularly, the present invention is directed to forming patterned substrates suitable for use in damascene processes.

Micro-fabrication involves the fabrication of very small structures, e.g., having features on the order of micro-meters or smaller. One area in which micro-fabrication has had a sizeable impact is in the processing of integrated circuits. As the semiconductor processing industry continues to strive for larger production yields while increasing the circuits per unit area formed on a substrate, micro-fabrication becomes increasingly important. Micro-fabrication provides greater process control, while allowing increased reduction of the minimum feature dimension of the structures formed.

A common process employed during the manufacturing of integrated circuits involves fabrication of metal conductive lines and contacts. The contacts interconnect adjacent conductive lines separated by a insulative layer. Conductive lines and contacts are often fabricated by forming a stepped structure in a substrate, referred to as a via and a trench. A common means by which to form the via-trench stepped structure is known as the damascene process.

Damascene involves forming grooves in an insulating layer and filling the same with a conductive material, such as aluminum, copper and the like. In this manner, conductive lines are formed in the groove. To form the contacts, as well as the conductive lines, a dual damascene process is typically employed to form a via in the region of the insulating layer in which the groove is formed.

An exemplary dual damascene process patterns, on the insulating layer, an image pattern of a via. To that end, the insulating layer is coated with a photo-resist and exposed through an appropriate mask which is then exposed to form the image pattern of the vias. The pattern is anisotropically etched in the upper portion of the insulating layer. The photo-resist is then exposed through a second mask with an image pattern of the grooves, after being aligned with the first mask pattern to encompass the vias. Anisotropically etching the grooves for the conductive lines in the upper portion of the insulating material results in the via, already present in the upper portion of the insulating layer, being simultaneously etched and replicated in the lower portion of the insulating material. After the etching is complete, both the vias and grooves are filled with a conductive material metal. Simultaneously filling both the grooves and vias with conductive material is an improvement over the single damascene process. However, the dual damascene process is attendant with disadvantages such as requiring alignment between two different masks. In addition, to increase process time and cost required by two mask steps, alignment becomes critical to properly position the groove with respect to the via.

There is a need, therefore, to provide improved processes for forming stepped structures in furtherance of the fabrication of integrated circuits.

SUMMARY OF THE INVENTION

The present invention provides a method for forming a stepped structure on a substrate and features transferring, into the substrate, an inverse shape of a multi-tiered structure. In one embodiment, the multi-tiered structure includes a bi-level protrusion having a projection and shoulders. The projection has an apex surface, and the shoulders are spaced-apart from the apex surface and the substrate, defining the shape. An exemplary use for the present invention is the formation of a self-aligned trench-via structure. To that end, the dimensions of the via portion are established as a function of the dimensions of the projection. The dimensions of the trench portion are established as a function of the dimensions of the shoulders. In another embodiment, the multi-tiered structure is an island formed on the substrate. These and other embodiments are described herein.

DETAILED DESCRIPTION OF THE INVENTION

Figure 1:
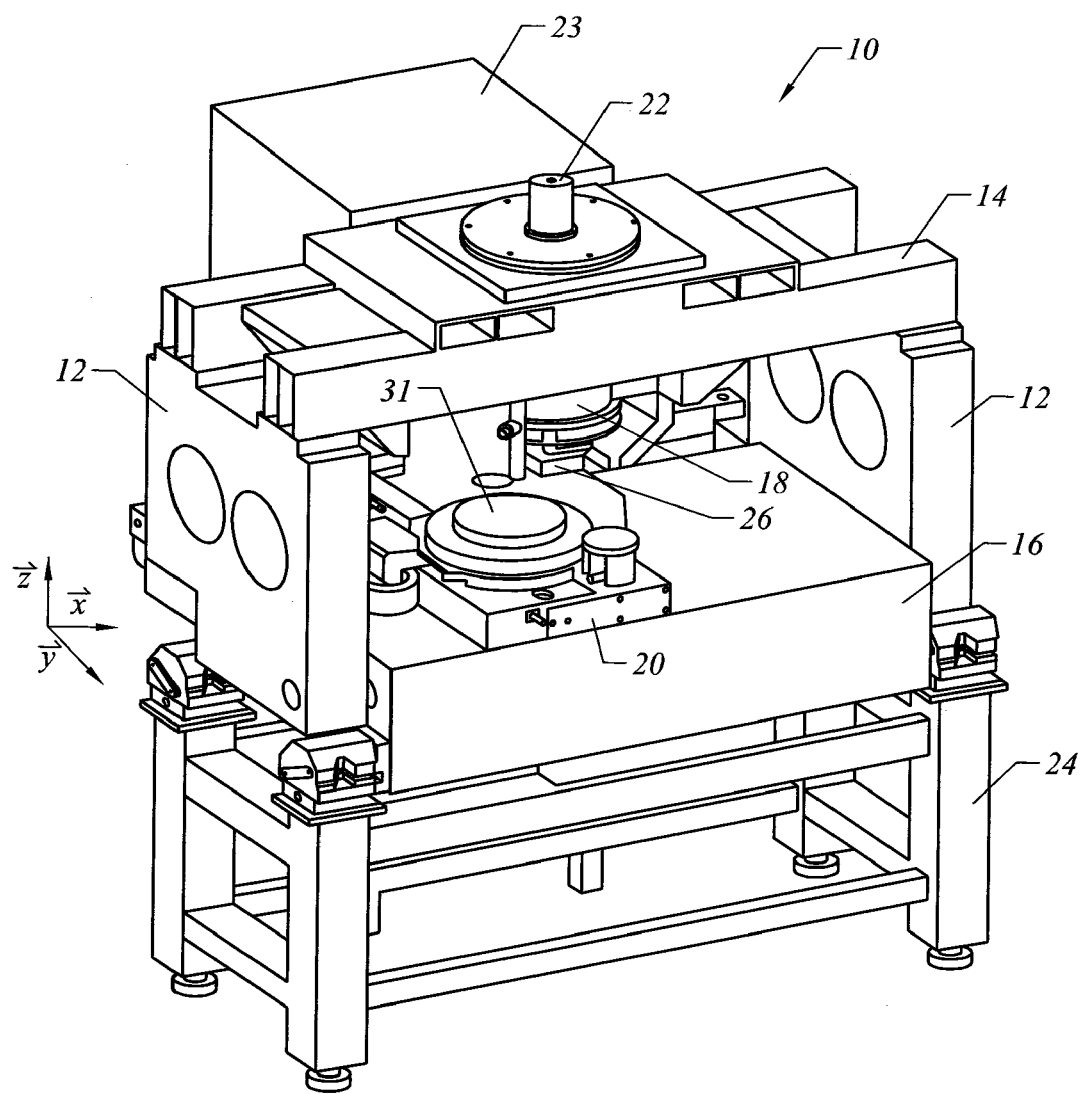
FIG. 1 is a perspective view of a lithographic system in accordance with the present invention.

FIG. 1 depicts a lithographic system 10 in accordance with one embodiment of the present invention that includes a pair of spaced-apart bridge supports 12 having a bridge 14 and a stage support 16 extending therebetween. Bridge 14 and stage support 16 are spaced-apart. Coupled to bridge 14 is an imprint head 18, which extends from bridge 14 toward stage support 16. Disposed upon stage support 16 to face imprint head 18 is a motion stage 20. Motion stage 20 is configured to move with respect to stage support 16 along X and Y axes. A radiation source 22 is coupled to system 10 to impinge actinic radiation upon motion stage 20. As shown, radiation source 22 is coupled to bridge 14 and includes a power generator 23 connected to radiation source 22.

Figure 2:
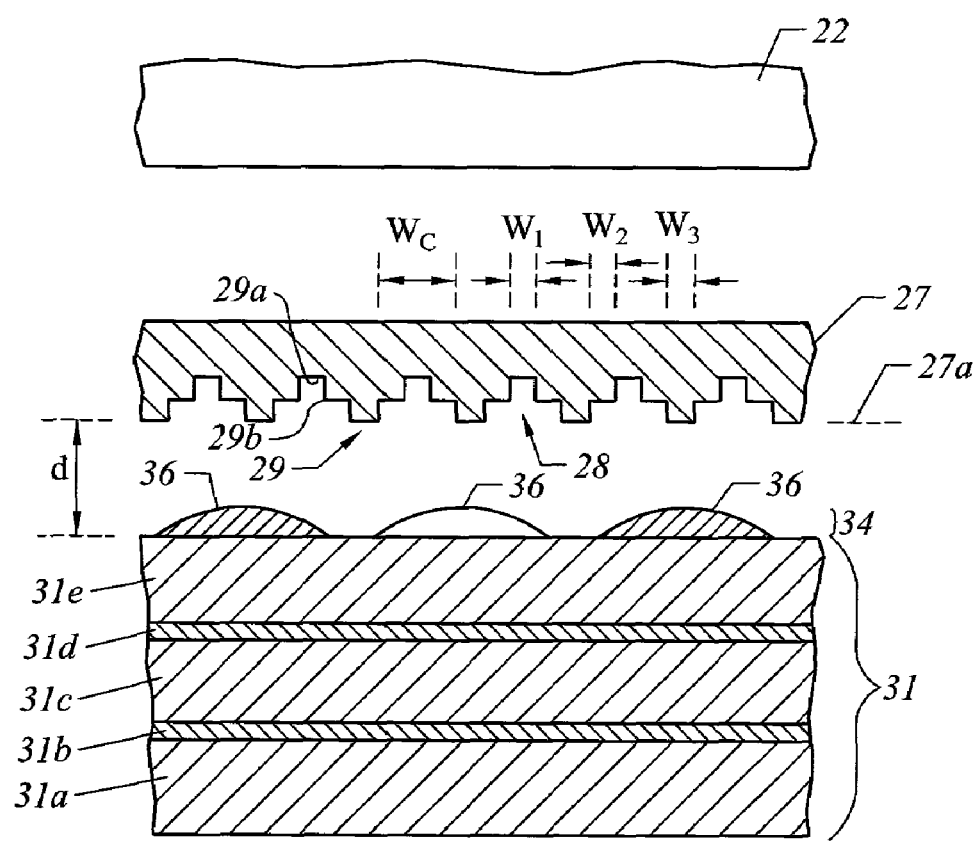
FIG. 2 is a simplified elevation view of a lithographic system, shown in FIG. 1, employed to create a patterned imprinting layer in accordance with the present invention.

Referring to both FIGS. 1 and 2, connected to imprint head 18 is a substrate 26 having a patterned mold 27 thereon. Patterned mold 27 includes a surface 27a having a pattern formed therein. The pattern is defined by a plurality of spaced-apart recesses 28 and protuberances 29. Recesses 28 have a stepped shape with a groove portion 29a flanked by stepped-portions 29b. The combined width, "$W_C$", of each recess 28 is a sum of a width "$W_1$" of groove portion 29a and $2W_2$, where $W_2$ is a width of one of stepped-portions 29b. Protuberances 29 have a width, "$W_3$". Each of widths, $W_1$, $W_2$ and $W_3$ are measured in a direction that extends transversely to the Z axis. The original pattern is to be transferred into a substrate 31 positioned on motion stage 20. Substrate 31 typically comprises of a wafer 31a made from a suitable material, such as silicon. Substrate 31 may also comprise of wafer 31a having one or more layers of material disposed thereon. In the present example, substrate 31 is shown as including multiple layers 31c and 31e of dielectric material, such as organosilicate glass (OSG), which has a composition of $Si_WC_XO_YH_Z$. Adjacent layers 31c and 31e of OSG may be separated by an etch barrier 31d made from any suitable material, such as titanium nitride (TiN). An additional etch barrier layer 31b may be positioned between dielectric layer 31c and wafer 31a.

Figure 3:
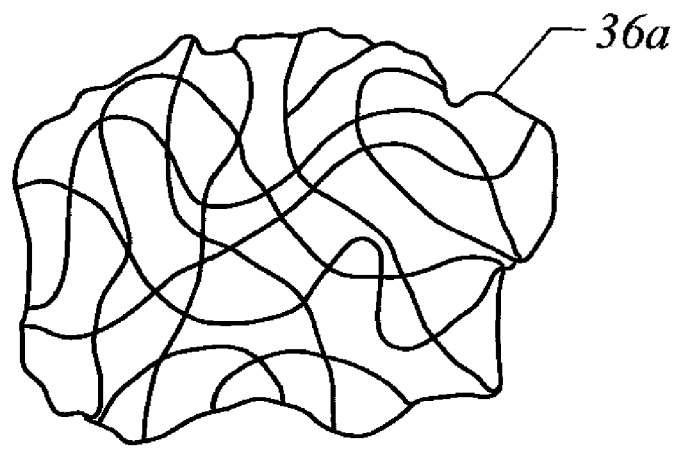
FIG. 3 is a simplified representation of material from which a patterned imprinting layer, shown in FIG. 2, is comprised before being polymerized and cross-linked in accordance with the present invention.
Figure 4:
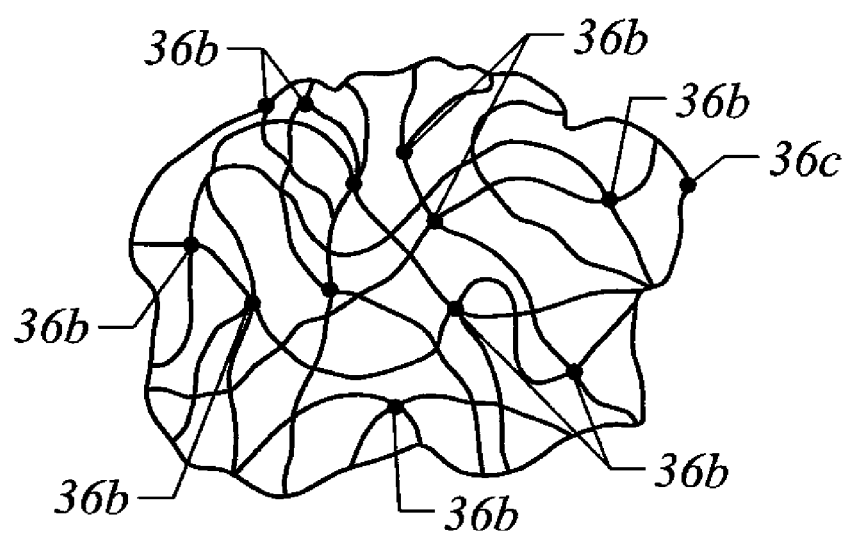
FIG. 4 is a simplified representation of cross-linked polymer material into which the material, shown in FIG. 3, is transformed after being subjected to radiation in accordance with the present invention.

Referring to both FIGS. 2 and 3, a flowable region, such as a patterned imprinting layer 34, is disposed on a portion of surface 32 that presents a substantially smooth profile. Flowable region may be formed using any known technique, such as a hot embossing process disclosed in U.S. Pat. No. 5,772,905, which is incorporated by reference in its entirety herein, or a laser assisted direct imprinting (LADI) process of the type described by Chou et al. in *Ultrafast and Direct Imprint of Nanostructures in Silicon*, Nature, Col. 417, pp. 835-837, June 2002. In the present embodiment, however, flowable region consists of patterned imprinting layer 34 being deposited as a plurality of spaced-apart discrete beads 36 of material 36a on substrate 31, discussed more fully below. Patterned imprinting layer 34 is formed from a substantially silicon-free material 36a that may be selectively polymerized and cross-linked to record the original pattern therein, defining a recorded pattern. Material 36a is shown in FIG. 4 as being cross-linked at points 36b, forming cross-linked polymer material 36c. An exemplary embodiment of material 36a is formed from a compound of approximately 48% by weight of a cyclohexyl acrylate, a monomer available from Polyscience Company, Niles Ill.; approximately 48% by weight ethylene glycol diacrylate, a cross-linking agent available from Sigma-Aldrich Corporation of St. Louis, Mo.; and approximately 4% by weight of a free radical generator sold under the tradename Darocur® and available from Ciba of Tarrytown, N.Y.

Figure 5:
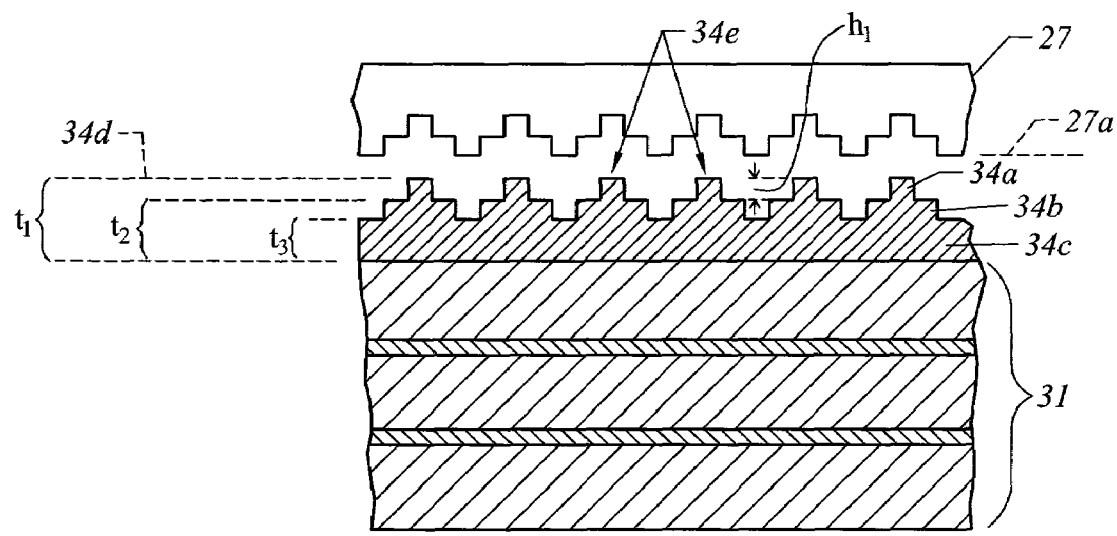
FIG. 5 is a simplified cross-sectional view of an imprint device spaced-apart from the patterned imprinting layer, shown in FIG. 1, after patterning in accordance with the present invention.

Referring to FIGS. 2, 3 and 5, the pattern recorded in patterned imprinting layer 34 is produced, in part, by mechanical contact with patterned mold 27. To that end, imprint head 18, shown in FIG. 1, is adapted to move along the Z axis and vary a distance "d" between patterned mold 27 and substrate 31. In this manner, patterned mold 27 spreads beads 36 so as to form patterned imprinting layer 34 with a contiguous formation of material 36a over surface 32. Alternatively, or in conjunction with imprint head 18, motion stage 20 may move substrate 26 along the Z-axis to allow mechanical contact between beads 36 and patterned mold 27. In one embodiment, distance "d" is reduced to allow sub-portions 34c of patterned imprinting layer 34 to ingress into and fill recesses 28. This facilitates the original pattern on patterned mold 27 to be imprinted into a flowable region of substrate 31.

To facilitate filling of recesses 28, material 36a is provided with the requisite properties to completely fill recesses 28 while covering surface 32 with a contiguous formation of material 36a. In the present embodiment, sub-portions 34c of patterned imprinting layer 34 in superimposition with protuberances 29 remain after the desired, usually minimum distance "d", has been reached, leaving a projection 34a with a thickness $t_1$, shoulders 34b with a thickness $t_2$ and sub-portions 34c with a thickness $t_3$. Projection 34a and shoulders 34b define a bi-level protrusion on surface 32 of substrate 31. Sub-portion 34c is referred to as a residual layer, and thickness $t_3$ is referred to as a residual thickness. Thicknesses "$t_1$", "$t_2$" and "$t_3$" may be any thickness desired, dependent upon the application.

Referring to FIGS. 2, 3 and 4, after a desired distance "d" has been reached, radiation source 22 produces actinic radiation that polymerizes and cross-links material 36a, forming cross-linked polymer material 36c. As a result, the composition of patterned imprinting layer 34 transforms from material 36a to material 36c, which is a solid. Specifically, material 36c is solidified to provide side 34d of patterned imprinting layer 34 with a shape conforming to a shape of a surface 27a of patterned mold 27, shown more clearly in FIG. 5. In this manner, a plurality of solidified bi-level protrusions 34e is formed on substrate 31. After patterned imprinting layer 34 is transformed to consist of material 36c, shown in FIG. 4, imprint head 18, shown in FIG. 1, is moved to increase distance "d" so that patterned mold 27 and patterned imprinting layer 34 are spaced-apart.

Figure 6:
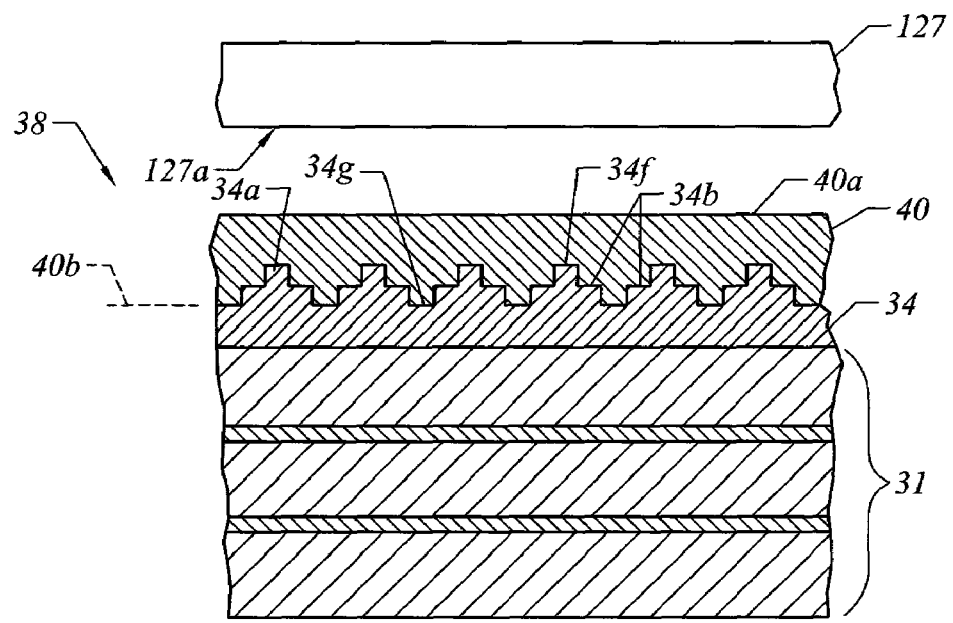
FIG. 6 is a simplified cross-sectional view of the patterned imprinting layer, shown in FIG. 5, after formation of a multi-layered structure by deposition of an etch selectivity layer, adjacent thereto, in accordance with one embodiment of the present invention.

An inverse shape of bi-level protrusions 34e is transferred into substrate 31 to form a via portion (not shown) and a trench portion (not shown) therein. In this manner, the dimensions of the via portion (not shown) are established as a function of the dimensions of projections 34a, and the dimensions of the trench portion (not shown) are established as a function of the dimensions of shoulders 34b. To that end, an etch selectivity layer 40, shown in FIG. 6, is disposed adjacent to patterned imprinting layer 34 after solidified bi-level protrusions 34e have been formed. Substrate 31, patterned imprinting layer 34 and etch selectivity layer 40 define a multi-layered structure 38.

Referring to FIG. 6, etch selectivity layer 40 may be applied using any known process, including chemical vapor deposition (CVD), physical vapor deposition (PVD), sputtering and spin-on techniques. Spin-on deposition of etch selectivity layer 40 may be beneficial when recording patterns having numerous features per unit area, i.e., a dense featured pattern. In the present example, etch selectivity layer 40 is deposited employing imprint lithography processes, such as those discussed above with respect to depositing patterned imprinting layer 34. To that end, etch selectivity layer 40 may be formed from a polymerizable material similar to that described above with respect to FIGS. 3 and 4, excepting that the material from which etch selectivity layer 40 is formed includes silicon, i.e., is a silicon-containing polymerizable material. An exemplary compound for use as etch selectivity layer 40 is formed approximately 48% by weight of a silyl acrylate sold under product code SIA 0210 and available from Gelest, Inc. of Morrisville, Pa.; approximately 24% by weight of a Butyl Acrylate monomer available from Sigma-Aldrich Corporation of St. Louis, Mo.; approximately 24% by weight of a silyl dimethacrylate sold under product code SIB 1402, from Gelest, Inc. of Morrisville Pa.; and approximately 4% by weight of a free radical generator sold under the tradename Darocur® and available from Ciba of Tarrytown, N.Y. Etch selectivity layer 40 includes first and second opposed sides. First side 40b faces patterned imprinting layer 34 and has a profile complementary to the profile of the patterned imprinting layer 34. The second side faces away from patterned imprinting layer 34 forming normalization surface 40a. Normalization surface 40a is provided with a substantially normalized profile, by ensuring that the distances, between an apex surface 34f of each of projections 34a and normalization surface 40a, are substantially the same and that the distance between each of shoulders 34b and normalization surface 40a is substantially the same and the distance between a nadir surface 34g of each of sub-portions 34c, shown in FIG. 5, and normalization surface 40a is the same. Furthermore, as shown in FIG. 6, substrate 31 is spaced-apart from etch selectively layer 40. More specifically, regions of substrate 31 in superimposition with regions of imprinting layer 34 defined between protrusions 34e, shown in FIG. 5, are spaced-apart from etch selectively layer 40.

One manner in which to provide normalization surface 40a with a normalized profile, involves use of a mold 127 having a smooth surface, i.e., featureless surface 127a, coming into contact with etch selectivity layer 40. As mentioned above, this may be accomplished by moving imprint head 18, shown in FIG. 1, along the Z-axis, moving motion stage 20 along the Z-axis, or both. Thereafter, mold 127 is separated from etch selectivity layer 40 and actinic radiation impinges upon etch selectivity layer 40 to polymerize and, therefore, solidify the same.

Figure 7:
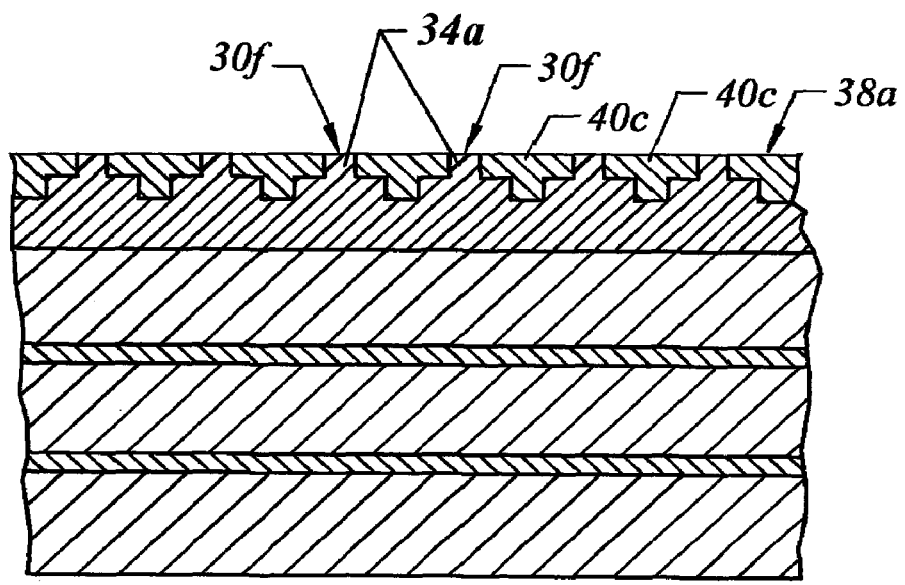
FIG. 7 is a simplified cross-sectional view after a blanket etch of the multi-layered structure, shown in FIG. 6, to form a crown surface, in accordance with one embodiment of the present invention.

Referring to FIGS. 6 and 7, a blanket etch is employed to remove portions of etch selectivity layer 40 to provide multi-layered structure 38 with a crown surface 38a. An exemplary etch process employs a $CF_4$ plasma etch where a predominant portion of the etch gases consists of $CF_4$. An exemplary etch chemistry is discussed by Johnson et al. in ADVANCES IN STEP AND FLASH IMPRINT LITHOGRAPHY, in a white paper distributed at the SPIE Microlithography conference held in Santa Clara, Calif. from Feb. 23-Feb. 28, 2003. Crown surface 38a is defined by an exposed apex surface 30f of each of projections 34a and upper surfaces of portions 40c that remain on etch selectivity layer 40 after the blanket etch.

Figure 8:
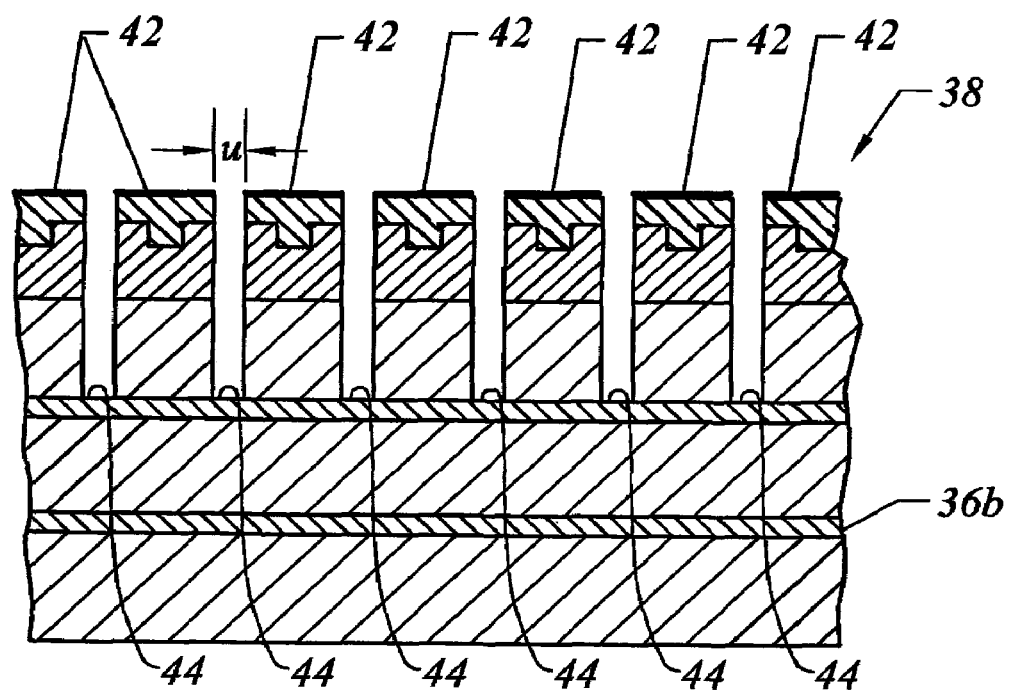
FIG. 8 is a simplified cross-sectional view of the multi-layered structure, shown in FIG. 7, after subjecting the crown surface to an etch to form via portions in the substrate, in accordance with one embodiment of the present invention.

Referring to FIGS. 7 and 8, crown surface 38a is subjected to an anisotropic etch. The etch chemistry of the anisotropic etch is selected to maximize etching of projections 34a and the segments of patterned imprinting layer 34, shown in FIG. 6, in superimposition therewith, while minimizing etching of the portions 40c. In the present example, advantage was taken of the distinction of the silicon content between the patterned imprinting layer 34 and the etch selectivity layer 40. Specifically, employing a plasma etch in which oxygen is the predominant gas, it was determined that an in-situ hardened mask 42 would be created in the regions of portions 40c proximate to crown surface 38a. An exemplary etch chemistry is discussed by Johnson et al. in ADVANCES IN STEP AND FLASH IMPRINT LITHOGRAPHY, in a white paper distributed at the SPIE Microlithography conference held in Santa Clara, Calif. from Feb. 23-Feb. 28, 2003. This results from the interaction of the silicon-containing polymerizable material with the oxygen-based plasma. As a result of the hardened mask 42 and the anisotropicity of the etch process, regions 44 on substrate 31 in superimposition with projections 34a are exposed. In the present example, regions 44 are exposed areas of etch barrier 31b, shown in FIG. 2. The width U of regions 44 is optimally equal to width $W_2$, shown in FIG. 2.

Figure 9:
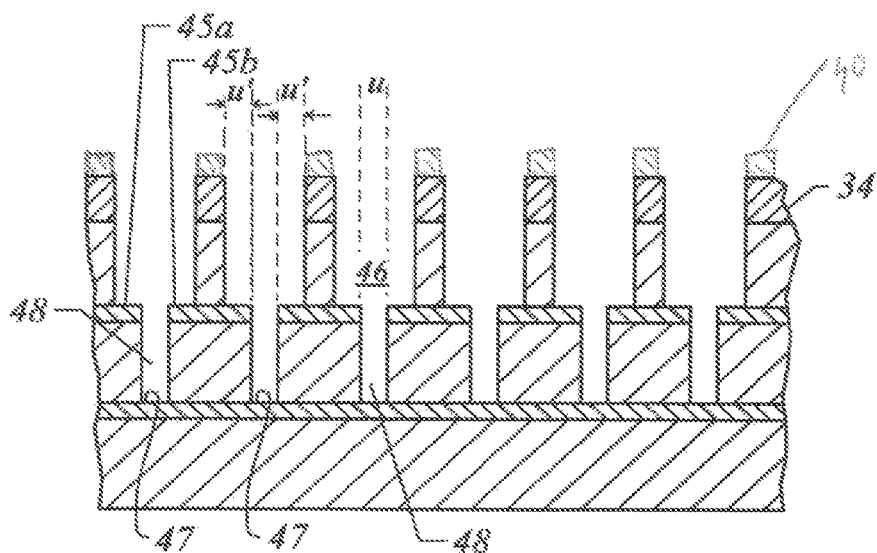
FIG. 9 is a simplified cross-sectional view of the multi-layered structure, shown in FIG. 8, after subjecting the crown surface to an anisotropic etch to form trench portions aligned with the via portions, in accordance with one embodiment of the present invention.
Figure 10:
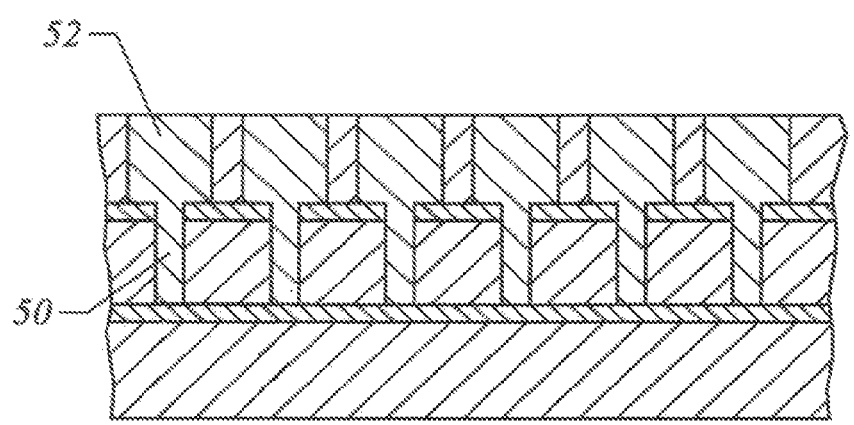
FIG. 10 is a simplified cross-sectional view of the multi-layered structure, shown in FIG. 9, after deposition of conductive material in the via portion and trench portion, in accordance with one embodiment of the present invention.

Referring to FIG. 8, after exposure of regions 44, a fluorine-based plasma etch, such as a type employing $CF_4$ gases discussed by Johnson et al. in ADVANCES IN STEP AND FLASH IMPRINT LITHOGRAPHY, in a white paper distributed at the SPIE Microlithography conference held in Santa Clara, Calif. from Feb. 23-Feb. 28, 2003, is employed to remove regions of multi-layered structure 38 in superimposition with hardened mask 42, shown in FIG. 7, to expose regions 45a and 45b, shown in FIG. 9, each of which has a width U', which is optimally equal to $W_2$. Regions 45a and 45b define a groove portion 46 and a throughway 48 extending from regions 45a and 45b to region 47 defining a via portion. The groove portion 46 defines a trench portion, and throughway 48 defines a via portion. A subsequent etch process is employed to remove remaining portions of layers 34 and 40. Thereafter, the via portion and the trench portion may be concurrently filled with a conductive material, such as aluminum, copper, tungsten, titanium, ti-tungsten or a combination thereof and the like, to form a contact 50 and a conductive line 52, shown in FIG. 10.

Referring to FIGS. 2, 7 and 8, the advantages of this process are manifold. For example, the relative etch rate between portions 40c and exposed apex surface 30f may be in a range of about 1.5:1 to about 100:1 due to the presence of the hardened mask 42. As a result, self-aligned vias and trenches may be formed in substrate 31 while precisely controlling the dimensions thereof. This reduces transfer distortions of the pattern on the inverse shape of bi-level protrusions 34e, shown in FIG. 5, into substrate 31.

Referring to FIGS. 5 and 9, additionally, the control of dimensional widths U and U' becomes relatively independent of residual thickness $t_3$. The rate at which the polymerizable fluid fills the pattern on patterned mold 27 is inversely proportional to the cube of residual thickness $t_3$. As a result, residual thickness $t_3$ may be selected to maximize throughput without substantially increasing transfer distortions. Finally, forming patterned imprinting layer 34 from a substantially silicon-free polymerizable fluid eases the cleaning process of patterned mold 27, especially considering that patterned mold 27 is often formed from fused silica.

Figure 11:
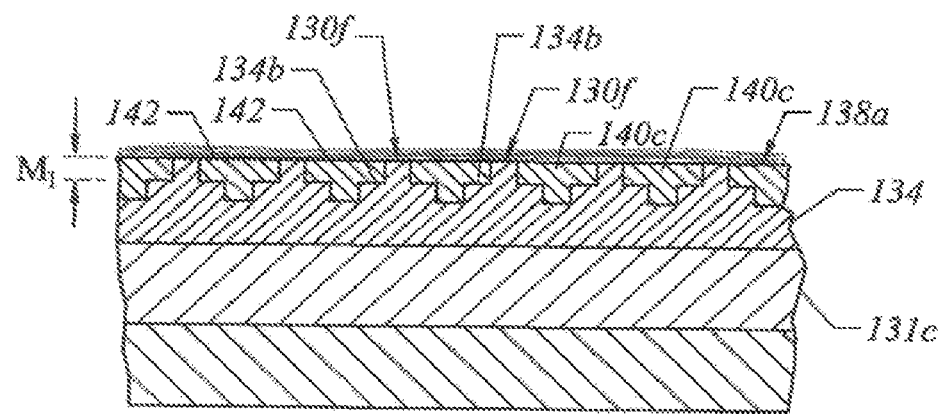
FIG. 11 is a simplified cross-sectional view after a blanket etch of the multi-layered structure, shown in FIG. 6, to form a crown surface, in accordance with a first alternate embodiment of the present invention.

Referring to FIGS. 2 and 11, an additional advantage with the present invention is that the need to use etch barrier layers 31d and 31b may be abrogated. As is well known, by avoiding the use of etch barrier layers 31d and 31b, the overall dielectric constant of substrate 31 may be reduced, thereby making this process suitable for fabricating vias and trenches in furtherance of the fabrication of high speed integrated circuits. To that end, etch conditions are established so that the material from which etch selectivity layer, shown in regions 140c, and dielectric layer 131c are established to be substantially inert to the etch chemistry employed to remove material from which patterned imprinting layer 34 is formed. In the present example, the material from which regions 140c and dielectric layer 131c are formed is relatively inert to an oxygen plasma etch.

Figure 12:
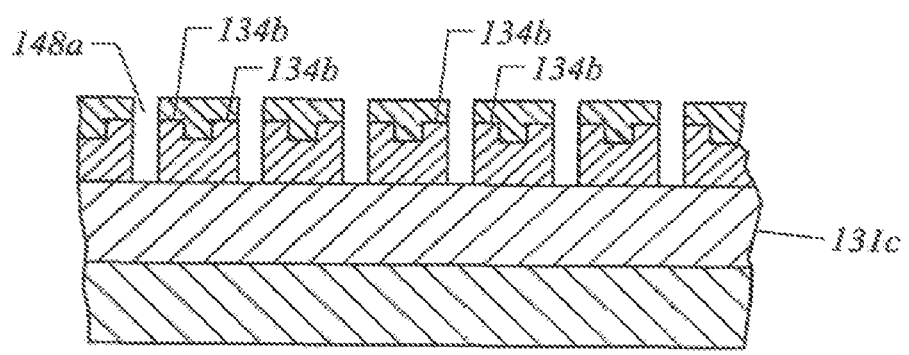
FIG. 12 is a simplified cross-sectional view of the multi-layered structure, shown in FIG. 11, after subjecting the crown surface to an anisotropic etch to form a first segment of a via portion in a substrate.

Referring to FIGS. 11 and 12, crown surface 138a, formed in a manner discussed above with respect to crown surface 38a in FIG. 7, is subjected to an oxygen plasma etch. As a result of the aforementioned etch selectivity differences, apex surface 130f, is removed along with the entire extent of projection 134a, shown as $m_1$, along with all material superimposed thereby in imprinting material layer 134. In this manner, a first segment 148a of via portion is formed.

A subsequent blanket plasma etch is employed using a fluorine-based chemistry, as discussed above. The blanket etch removes hardened mask 142 and regions 140c, shown in FIG. 11, to expose shoulders 134b, shown in FIG. 13. Concurrently with exposing shoulders 134b, a second segment 148b of via portion (not shown) is formed by removal of material of dielectric layer 131c, shown as $m_2$.

Figure 13:
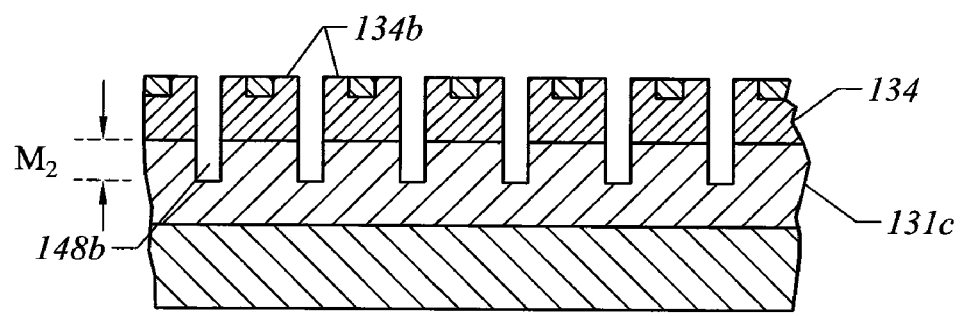
FIG. 13 is a simplified cross-sectional view of the multi-layered structure, shown in FIG. 12, after subjecting the crown surface to a blanket etch to expose regions of the patterned imprinting layer and form a second segment of a via portion.
Figure 14:
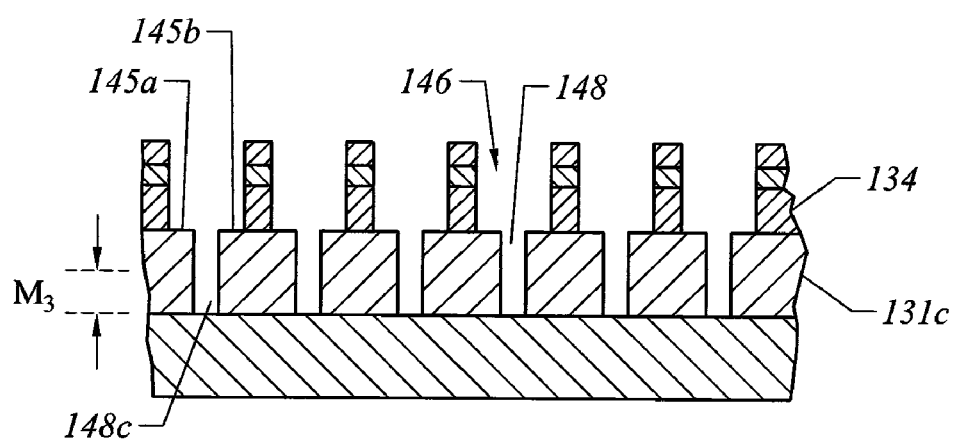
FIG. 14 is a simplified cross-sectional view of the multi-layered structure, shown in FIG. 13, subjecting the same to an anisotropic fluorine etch to form a trench portion and a third segment of a via portion.

Referring to FIGS. 13 and 14, an anisotropic oxygen-based plasma etch is employed to remove hardened shoulders 134b, as well as material of imprinting material layer 134 in superimposition therewith to expose regions 145a and 145b of dielectric layer 131c, thereby forming a trench portion 146. Concurrently with exposing regions 145a and 145b, a third segment 148c of the via portion is formed by removal of material of dielectric layer 131c, shown as $m_3$. The combined length of via segments 148a, 148b and 148c define a via portion 148 that is aligned with trench portion 146. In this manner, a self-aligned via and trench may be fabricated.

Figure 15:
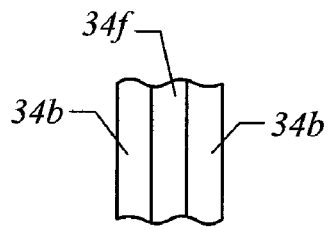
FIG. 15 is a top down view of protrusions, shown in FIG. 5, in accordance with a second alternate embodiment of the present invention.
Figure 16:
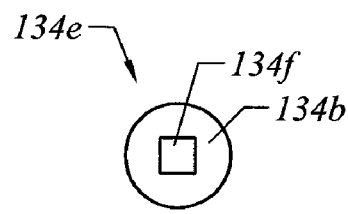
FIG. 16 is a top down view of protrusions, shown in FIG. 5, in accordance with a third alternate embodiment of the present invention.

Referring to FIGS. 5 and 15, although the present invention has been discussed with respect to formation of a self-aligned via and trench, the present invention may be employed to form various multi-tiered structures. For example, as shown in FIG. 5, associated with each protrusion 34e may be a pair of spaced-apart shoulders 34b equally spaced from apex surface 34f a height $h_1$ and flanking projection 34a. Alternatively, protrusion 134e may include a single shoulder 134b concentric about apex surface 134f, shown in FIG. 16.

Figure 17:
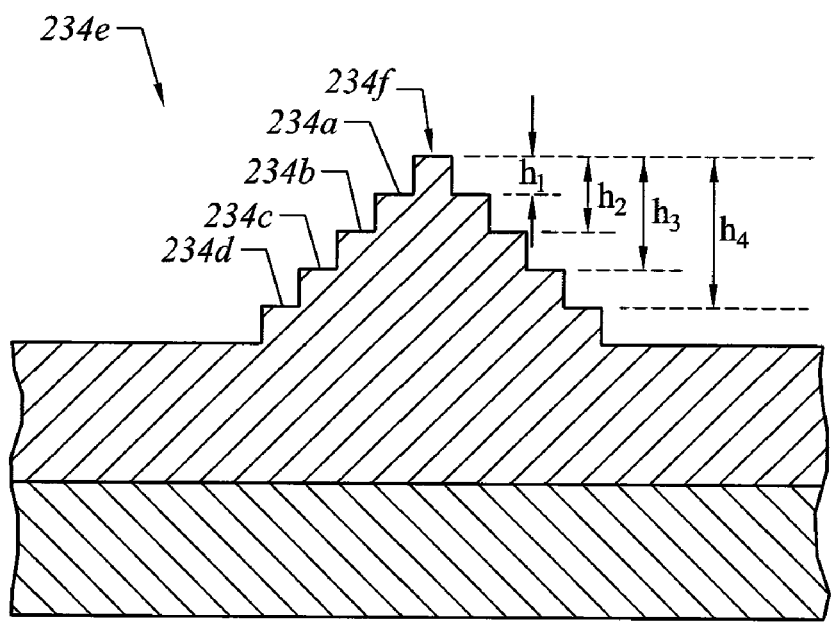
FIG. 17 is a cross-sectional view of the protrusions shown in FIG. 5, in accordance with a fourth alternate embodiment of the present invention.
Figure 18:
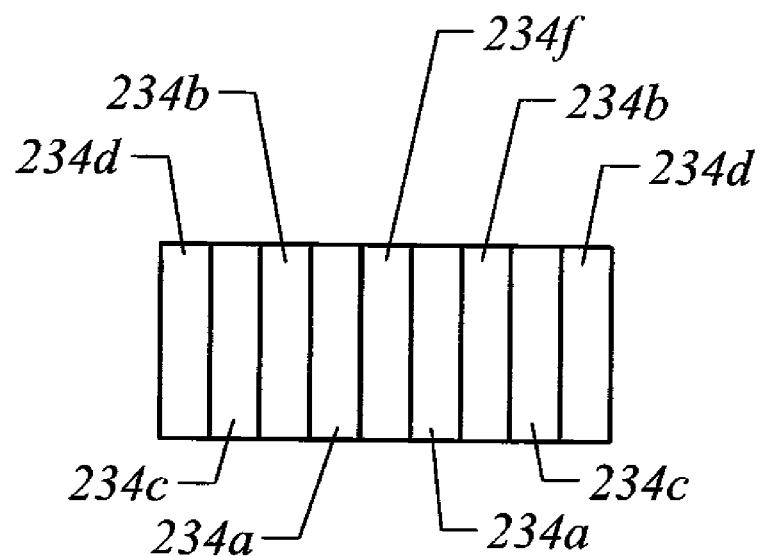
FIG. 18 is a top down view of protrusions, shown in FIG. 17, in accordance with a fifth alternate embodiment of the present invention.
Figure 19:
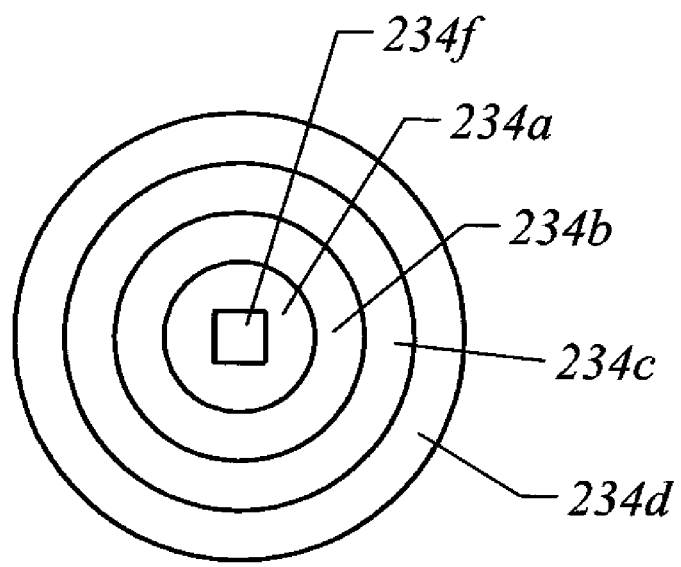
FIG. 19 is a top down view of protrusions, shown in FIG. 17, in accordance with a sixth alternate embodiment of the present invention.
Figure 20:
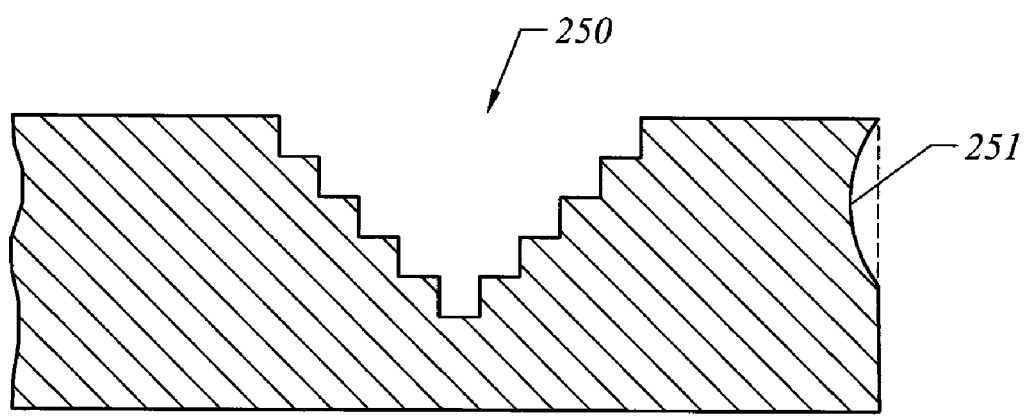
FIG. 20 is a view of a substrate having formed therein a recess that is an inverse shape of the protrusion shown in FIG. 17.

Referring to FIG. 17, additionally, each protrusion 234e may include a plurality of shoulders 234a, 234b, 234c and 234d, spaced-apart from apex surface 234f at differing heights $h_1$, $h_2$, $h_3$ and $h_4$, respectively. Although four sets of shoulders 234a, 234b, 234c and 234d are shown, in reality any number may be included from 0 to n, where "n" is an integer number. To that end, a mold (not shown) would have one or more recesses formed into a surface thereof that would be complementary to the shape of protrusion 234e. Further, shoulders 234a, 234b, 234c and 234d may flank apex surface 234f, as shown in FIG. 18. Alternatively, shoulders 234a, 234b, 234c and 234d may be concentrically disposed about apex surface 234f, as shown in FIG. 19. Employing protrusion 234e, a substrate 231 may be formed to have a recess complementary to the shape of protrusion 234e, shown as 250 in FIG. 20. Although substrate 231 is shown as being from a homogenous material, e.g. silicon, any number of layers (not shown) of material may be included on substrate 231 and recess 250 may be formed in one or more of the aforementioned layers and/or substrate 231.

Further, the layers may consist of any material suitable for semiconductor processing.

Figure 21:
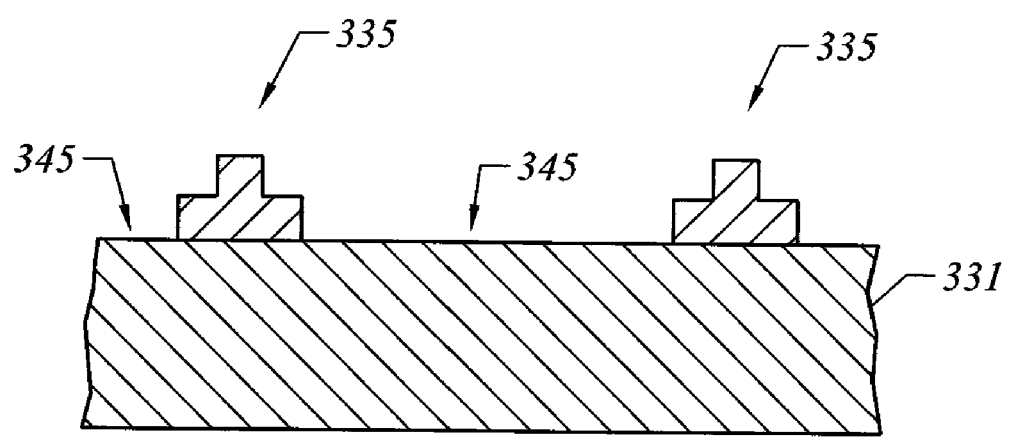
FIG. 21 is a cross-sectional view of a substrate having islands formed thereon, in accordance with a seventh alternate embodiment of the present invention.

Referring to FIGS. 2 and 21, the foregoing has been discussed with respect to formation of recesses on substrate 31 employing a mold 27 having a plurality of recesses formed therein. However, the same processes mentioned above may be employed to form islands 335 on substrate 331. To that end, mold 327, shown in FIG. 22, includes one or more protrusions 328 extending from a surface 328a having a projection 328b and shoulder 328c spaced-apart from projection 328b between surface 328a and projection 328b. A layer of imprinting material is disposed on substrate 331 and spread to form a patterned layer 334 as discussed above. In this manner, patterned layer 334 includes a pattern complementary to the pattern on mold 327. In the present example, this results in one or more recesses 334a being formed in patterned layer 334.

Figure 22:
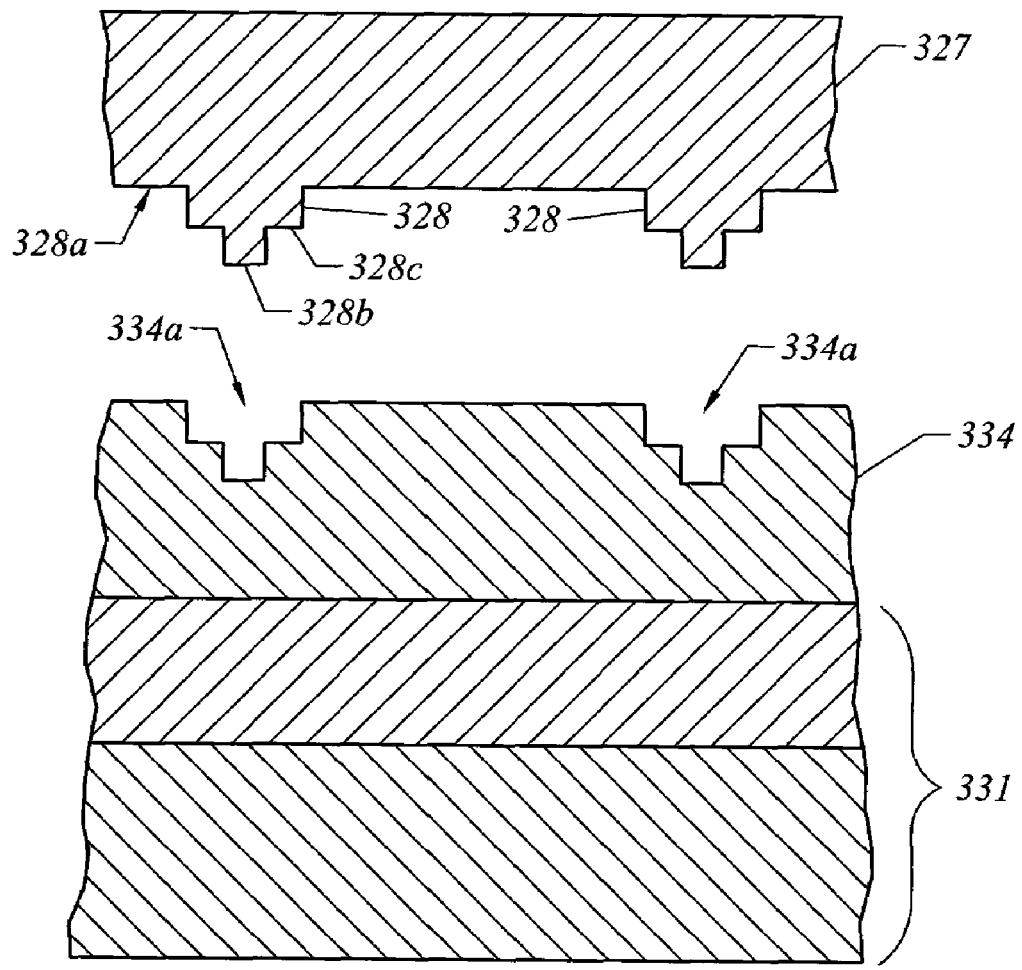
FIG. 22 is a simplified cross-sectional view showing a mold and patterned layer having a shape complementary to the mold employed to form the protrusions shown in FIG. 21.
Figure 23:
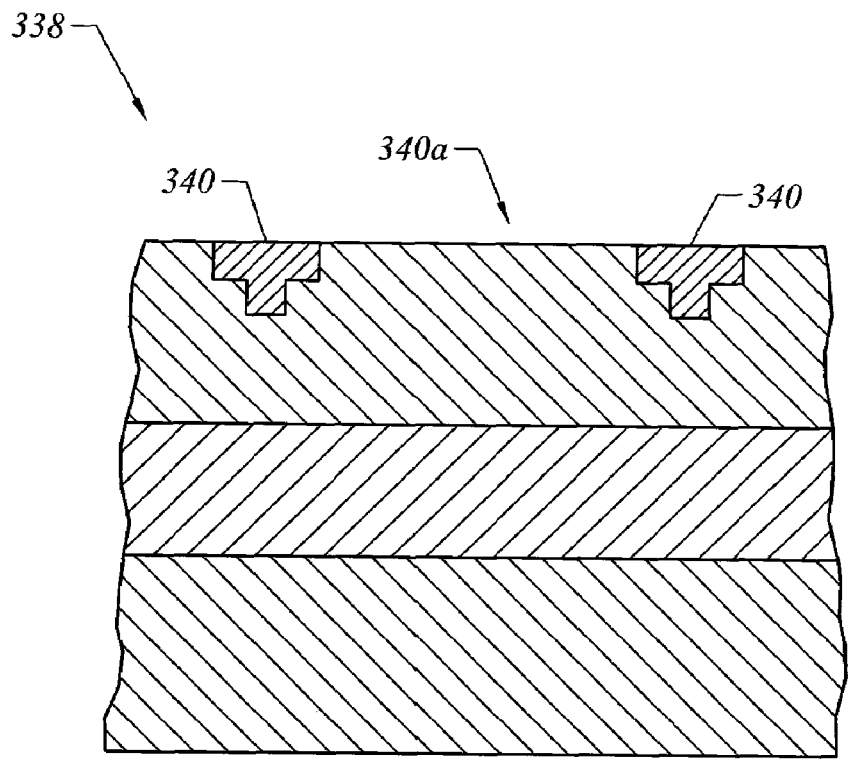
FIG. 23 is a cross-sectional view showing a crown surface formed after etching of an etch selectivity layer deposited on the patterned layer shown in FIG. 22.

Referring to FIGS. 22 and 23, thereafter an etch selectivity layer 340 is disposed upon patterned layer 334 and a crown surface 340a to form a multi-layered structure 338 formed as discussed above. In this fashion, the only portions of etch selectivity layer 340 remaining after formation of crown surface 340a fills recesses 334a. Crown surface 340a is exposed to an oxygen etch chemistry that is highly selective in portions of patterned layer 334 not superimposed by recesses 334a and is removed to expose regions 344 of substrate 331, shown in FIG. 24. This is achieved, in part, due to a hardened mask 342 that is formed by the silicon present in the remaining portions of etch selectivity layer 340 when exposed to a plasma etch using a chemistry that is predominantly composed of oxygen gases, as discussed above.

Figure 24:
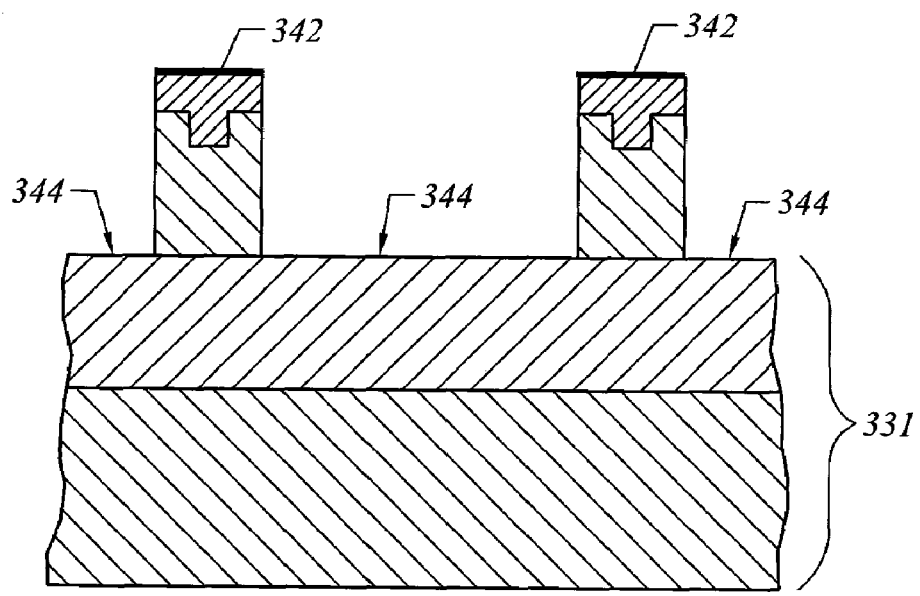
FIG. 24 is cross-sectional view of the multi-layered structure, shown in FIG. 23, after subjecting the crown surface to an etch to expose regions of the substrate.

Referring to FIGS. 21 and 24, after exposure of regions 344, a fluorine-based plasma etch, such as a type discussed above, is employed to remove regions of multi-layered structure 338, shown in FIG. 23, in superimposition with hardened mask 342 to expose regions 345. Specifically, the etch rate differential between regions 344 and hardened mask 342 results in the formation of islands 335. It should be understood, however, that any of the stepped features mentioned above, may be formed in this manner, depending upon the pattern on mold 327, shown in FIG. 22. Further, although substrate 331 is shown as being from a homogenous material, e.g. silicon, any number of layers (not shown) of material may be included on substrate 331 and islands 335 may be formed in one or more of the aforementioned layers and/or substrate 331. Further, the layers may consist of any material suitable for semiconductor processing.

Referring to both FIGS. 1 and 2, an exemplary radiation source 22 may produce ultraviolet radiation. Other radiation sources may be employed, such as thermal, electromagnetic and the like. The selection of radiation employed to initiate the polymerization of the material in patterned imprinting layer 34 is known to one skilled in the art and typically depends on the specific application which is desired. Radiation source 22 is located so that patterned mold 27 is positioned between radiation source 22 and substrate 31. As a result, substrate 31 and/or patterned mold 27 may be fabricated from materials that allow the same to be substantially transparent to the radiation produced by radiation source 22. Exemplary materials include, but are not limited to, fused-silica, quartz, silicon, organic polymers, siloxane polymers, borosilicate glass, fluorocarbon polymers, metal, and combinations of the above.

It may be desired to manufacture components of system 10 from materials that are thermally stable, e.g., have a thermal expansion coefficient of less than about 10 ppm/degree Centigrade at about room temperature (e.g. 25 degrees Centigrade). In some embodiments, the material of construction may have a thermal expansion coefficient of less than about 10 ppm/degree Centigrade, or less than 1 ppm/degree Centigrade. To that end, bridge supports 12, bridge 14, and/or stage support 16 may be fabricated from one or more of the following materials: silicon carbide, iron alloys available under the trade-name INVAR®, or trade-name SUPER INVAR™, ceramics, including but not limited to ZERODUR® ceramic. Additionally, table 24 may be constructed to isolate the remaining components of system 10 from vibrations in the surrounding environment. An exemplary table 24 is available from Newport Corporation of Irvine, Calif.

Referring to FIGS. 1, 2 and 3, the characteristics of material 36a are important to efficiently pattern substrate 31 in light of the unique deposition process employed. As mentioned above, material 36a is deposited on substrate 31 as a plurality of discrete and spaced-apart beads 36. The combined volume of beads 36 is such that the material 36a is distributed appropriately over an area of surface 32 where patterned imprinting layer 34 is to be formed. As a result, patterned imprinting layer 34 is spread and patterned concurrently, with the pattern being subsequently set by exposure to radiation, such as ultraviolet radiation. As a result of the deposition process it is desired that material 36a have certain characteristics to facilitate rapid and even spreading of material 36a in beads 36 over surface 32 so that all thicknesses $t_1$ are substantially uniform and all residual thicknesses $t_2$ are substantially uniform.

Figure 25:
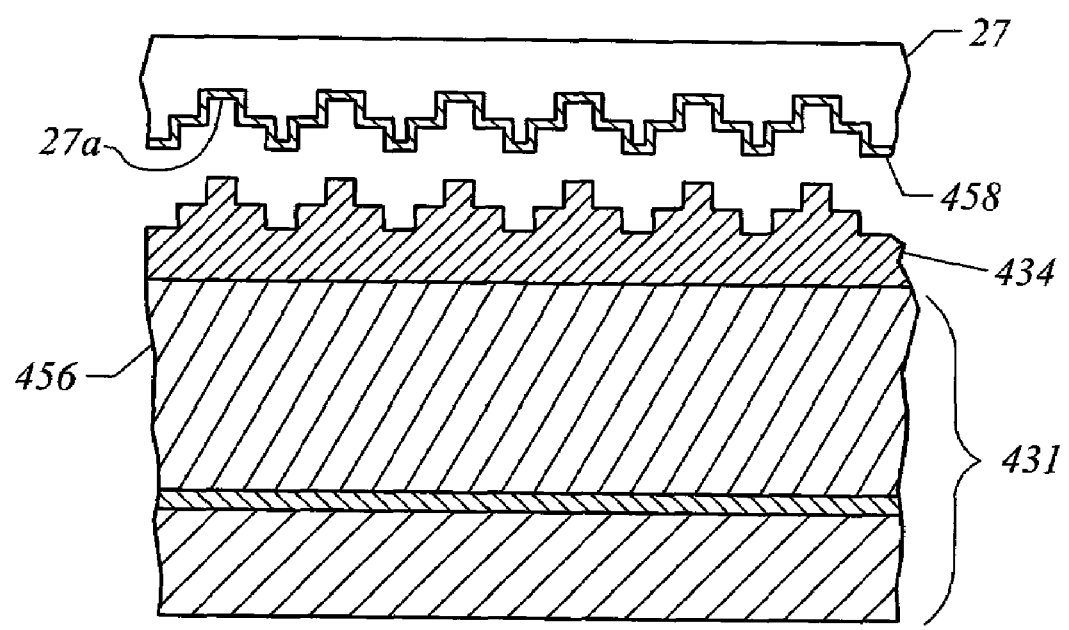
FIG. 25 is a simplified cross-sectional view of the substrate and imprint device, shown in FIG. 5, in accordance with an eighth alternate embodiment of the present invention.

Referring to FIGS. 3 and 25, employing the compositions described above in material 36a, to facilitate imprint lithography is achieved by including, on substrate 431, a primer layer 456. Primer layer 456 functions, inter alia, to provide a standard interface with patterned imprinting layer 434, thereby reducing the need to customize each process to the material from which substrate 431 is formed. In addition, primer layer 456 may be formed from an organic material with the same etch characteristics as patterned imprinting layer 434. Primer layer 456 is fabricated in such a manner so as to possess a continuous, smooth, relatively defect-free surface that may exhibit excellent adhesion to patterned imprinting layer 434.

Additionally, to ensure that patterned imprinting layer 434 does not adhere to patterned mold 27, surface 27a may be treated with a low surface energy coating 458. As a result, patterned imprinting layer 434 is located between primer layer 456 and coating 458 upon contact of patterned mold 27 with substrate 431. Coating 458 may be applied using any known process. For example, processing techniques may include chemical vapor deposition method, physical vapor deposition, atomic layer deposition or various other techniques, brazing and the like. In a similar fashion a low surface energy coating may be applied to mold 127, shown in FIG. 6. Alternatively, release properties of either patterned imprinting layer 34 or etch selectivity layer 40 may be improved by including, in the material from which the same is fabricated, a compound having low surface energy, referred to as a surfactant. The compound is caused to migrate to a surface of layer therewith to interface with molds 27 and/or 127, shown in FIGS. 2 and 6, respectively, using known techniques. Typically, the surfactant has a surface energy associated therewith that is lower than a surface energy of the polymerizable material in the layer. An exemplary material and process by which to form the aforementioned surfactant is discussed by Bender et al. in MULTIPLE IMPRINTING IN UV-BASED NANOIMPRINT LITHOGRAPHY: RELATED MATERIAL ISSUES, Microelectronic Engineering pp. 61-62 (2002). The low surface energy of the surfactant provides the desired release properties to reduce adherence of either imprinting layer 34 or etch selectivity layer 40 to molds 27 and/or 127, shown in FIGS. 2 and 6, respectively. It should be understood that the surfactant may be used in conjunction with, or in lieu of, low surface energy coatings 458, shown in FIG. 25.

The embodiments of the present invention described above are exemplary. Many changes and modifications may be made to the disclosure recited above, while remaining within the scope of the invention. The scope of the invention should, therefore, be determined not with reference to the above description, but instead should be determined with reference to the appended claims along with their full scope of equivalents.

What is claimed is:

1. A method of forming a stepped-structure on a substrate, said method comprising:
   forming, on said substrate, a multi-tiered structure including a patterned layer having protrusions and recessions, and an etch selectivity layer, with said patterned layer being disposed between said substrate and said etch selectivity layer, with regions of said substrate in superimposition with said recessions being spaced-apart from said etch selectivity layer;
   forming a hard mask in areas of said multi-tiered structure in superimposition with said recessions; and
   removing, selectively, portions of said multi-tiered structure to expose regions of said substrate in superimposition with said protrusions to form said stepped structure.

2. The method as recited in claim 1 wherein removing further includes forming, in said substrate, a via portion and a trench portion, with dimensions of said via portion being established as a function of dimensions of said protrusions and dimensions of said trench portion being established as a function of dimensions of said recessions.

3. The method as recited in claim 1 wherein removing further includes depositing said multi-layered structure on said substrate by depositing a polymerizable fluid composition on said substrate and contacting said composition with a mold having a relief structure including a shape complementary to said shape of said multi-tiered structure and exposing said composition to actinic radiation to polymerize said composition, defining a polymerized composition and covering said polymerized composition with said etch selectivity layer.

4. The method as recited in claim 1 wherein forming further includes forming said multi-tiered structure from an organic polymerizable material substantially free of silicon and covering said multi-tiered structure with said etch selectivity layer formed from a silicon-containing material.

5. The method as recited in claim 1 wherein forming further includes forming said multi-tiered structure from a material having a polymerizable compound and a surfactant having a surface energy that is less than a surface energy of said polymerizable compound.

6. The method as recited in claim 1 wherein said etch selectivity layer is formed from a material having a polymerizable compound and a surfactant having a surface energy that is lower than a surface energy of said polymerizable compound.

7. The method as recited in claim 1 wherein forming said etch selectivity layer includes spin-coating a silicon-containing material on said multi-tiered structure.

8. The method as recited in claim 1 further including forming, on said substrate, an etch stop layer positioned between said substrate and said multi-tiered structure.

9. The method as recited in claim 2 further including depositing in said via portion and said trench portion, a conductive material.

10. The method as recited in claim 1 wherein said multi-tiered structure includes a stepped recess.

11. The method as recited in claim 1 wherein said multi-tiered structure includes a bi-level protrusion including a projection and shoulders, with said projection having an apex surface and said shoulders being spaced-apart from said apex surface and said substrate.

12. The method as recited in claim 11 further including forming said substrate from a wafer and a film layer and wherein removing further includes exposing regions of said film layer.

13. A method of forming a stepped-structure on a substrate, said method comprising:
creating a multi-layered structure by forming, on said substrate, a multi-tiered patterned layer having protrusions and recessions, and forming, upon said patterned layer, an etch selectivity layer, with regions of said substrate in superimposition with said recessions being spaced-apart from said etch selectivity layer, said multi-layered structure having a crown surface facing away from said substrate; and
selectively removing portions of said multi-layered structure to expose regions of said substrate in superimposition with said protrusions forming, in said substrate, a via portion and a trench portion.

14. The method as recited in claim 13 further including depositing in said via portion and said trench portion, a conductive material.

15. The method as recited in claim 13 wherein dimensions of said via portion being established as a function of dimensions of said protrusion and dimensions of said trench portion being established as a function of dimensions of said recessions.

16. The method as recited in claim 13 wherein removing further includes exposing regions while forming a hard mask in areas of said etch selectivity layer in superimposition with said recessions.

17. The method as recited in claim 13 wherein forming further includes depositing a polymerizable fluid composition on said substrate and contacting said composition with a mold having a relief to form said patterned layer and exposing said composition to actinic radiation to polymerize said composition.

18. The method as recited in claim 13 wherein forming further includes forming said patterned layered structure from an organic polymerizable material substantially free of silicon and forming said etch selectivity layer from a silicon-containing material.

19. The method as recited in claim 13 wherein forming further includes forming said patterned layer from a material having a polymerizable compound and a surfactant having a surface energy that is less than a surface energy of said polymerizable compound.

20. The method as recited in claim 13 wherein forming further includes disposing said etch selectivity layer by spin-coating a silicon-containing material on said patterned layer.

21. The method as recited in claim 13 further including forming, on said substrate, an etch stop layer positioned between said substrate and said patterned layer.

22. The method as recited in claim 13 wherein said multi-tiered pattern includes a stepped recess.

23. The method as recited in claim 13 wherein said multi-tiered pattern includes a bi-level protrusion including a projection and shoulders, with said projection having an apex surface and said shoulders being spaced-apart from said apex surface and said substrate.

24. The method as recited in claim 23 further including forming said substrate from said wafer and said film layer and wherein removing further includes exposing regions of said film layer.

25. A method of forming a stepped-structure on a substrate, said method comprising:
forming, on said substrate, a multi-tiered structure including a patterned layer having protrusions and recessions, and an etch selectivity layer, with said patterned layer being disposed between said substrate and said etch selectivity layer, with regions of said substrate in superimposition with said recessions being spaced-apart from said etch selectivity layer; and
removing, selectively, portions of said multi-tiered structure to expose regions of said substrate in superimposition with said protrusions to form said stepped structure having a via portion and a trench portion, with dimensions of said via portion being established as a function of dimension of said protrusions and dimensions of said trench portion being established as a function of dimensions of said recessions.

* * * * *